United States Patent [19]

Wycoff et al.

[11] 4,431,990

[45] Feb. 14, 1984

[54] SELECTIVE CALL COMMUNICATION RECEIVER

[75] Inventors: Keith H. Wycoff, 1205 N. Tyler St., Lexington, Nebr. 68850; William H. Dittmer, Lexington, Nebr.

[73] Assignee: Keith H. Wycoff, Lexington, Nebr.

[21] Appl. No.: 346,721

[22] Filed: Feb. 8, 1982

Related U.S. Application Data

[62] Division of Ser. No. 46,510, Jun. 7, 1979, Pat. No. 4,385,398.

[51] Int. Cl.$^3$ .............................................. H04Q 9/12
[52] U.S. Cl. ........................... 340/825.48; 340/825.63
[58] Field of Search ...................... 340/825.44, 825.37, 340/825.63, 825.47, 825.55, 825.48

[56] References Cited

U.S. PATENT DOCUMENTS

| | | | |
|---|---|---|---|
| 3,769,593 | 10/1973 | Williams | 340/825.44 |
| 4,069,477 | 1/1978 | Maben | 340/825.47 |
| 4,194,153 | 3/1980 | Masaki et al. | 340/825.55 |
| 4,245,347 | 1/1981 | Hutton et al. | 340/825.63 |
| 4,315,249 | 2/1982 | Apple et al. | 340/825.63 |

*Primary Examiner*—Donald J. Yusko
*Attorney, Agent, or Firm*—Dithmar, Stotland, Stratman & Levy

[57] ABSTRACT

The receiver comprises a processor circuit which receives and processes a modulated carrier wave. The modulation is a code consisting of a single tone or a sequence of tones, followed by intelligence signals. The processor circuit separates the code and the intelligence signals from the carrier wave. The receiver also comprises a decoder circuit responsive to a given code to provide an enabling signal. An audio circuit is rendered operative by the enabling signal so that it can process the ensuing intelligence signals. The receiver has a push-button switch which can be actuated at any time to monitor the channel. Such switch is associated with a timer and an electronic switch.

A first optional connection may be made internally in the receiver, whereby actuations of the push-button switch places the receiver in a monitor mode so that it will be continuously on. Subsequent actuation of the switch will cause the receiver to revert to its tone-squelch mode.

A second optional connection may be made internally in the receiver so that a proper code will unsquelch the receiver for a certain time and thereafter place the receiver in condition to be unsquelched by just the carrier wave. Subsequent actuation of the push-button switch will cause the receiver to revert to its code-squelch mode. The receiver can manually be placed in the carrier-squelch mode by actuating the same switch for at least a certain time.

The receiver further comprises a battery saver circuit which produces a pulsed supply voltage for the processor circuit, the decoder circuit and the audio circuit. While the correct first tone is being received, the battery saver circuit provides a continuous supply voltage to these various circuits, which voltage is maintained during the entirety of the code and for a time thereafter.

When the second optional connection is made, as described above, the rate of the pulsed supply voltage produced after such time has passed will be increased. Alternately, if the push-button switch is operated, the receiver will be manually placed in the carrier-squelch mode, and the rate of the pulsed supply voltage will be increased. Subsequent operation of the push-button switch will reset the receiver to the code-squelch mode and cause the pulsed supply voltage to revert to its usual rate.

A two-tone decoder circuit includes a normally operative channel for the first tone and a normally inoperative channel for the second tone. The first channel includes a frequency discriminator responsive to a first tone of predetermined frequency. The first channel also includes means to convert the first tone into a train of pulses. A delay circuit in the first channel produces a train of modified tone pulses commencing a first predetermined time after the start of detection of the first tone, to render ensuing circuitry nonresponsive to glitches (extraneous pulses such as noise and the like). An envelope detector produces an output pulse when tone pulses are absent for a second predetermined time. A latch is set by the first of the tone pulses and is reset by the output pulse. Accordingly, a tone signal is produced which commences a first predetermined time after the first tone starts and ends a second predetermined time after that tone ends.

The first channel further includes a duration detector which responds to a tone signal of at least a predetermined duration to produce an enabling signal commencing with the termination of the first tone. The enabling signal is coupled to the second channel which has the same basic elements as the first channel, namely a frequency discriminator responsive to the second tone, means to convert the second tone into a train of pulses, a delay circuit, an envelope detector, a latch and a duration detector. The duration detector provides detected signals representative of the duration of such second tone. A control circuit produces one of a plurality of alerting tones having characteristics and durations corresponding to the detected signals. A gate circuit is rendered operative by a control signal from the control circuit to apply the alerting tone to the audio circuit. In the absence of such control signal, the output of the gate floats so as not to load the audio circuit while it is processing the intelligence signals.

The first tone in the two-tone sequence may have one of two durations. A shorter first tone will enable the second channel as just described, while an even longer first tone bypasses the second channel to cause an alerting tone to be applied to the audio circuit. Such longer tone will similarly enable all receivers responsive to that same first tone to call them as a group.

An optional connection may be made in the first channel to cause it to respond to a first tone of longer-than-normal duration to provide an output which also bypasses the second channel. This option enables ready conversion to a single tone receiver.

The decoder further includes an oscillator and a chain of free-running, divide-by-two circuits to produce a plurality of clock frequencies. Each of the circuits described above includes one or more chains of resettable divide-by-two circuits connected to the clock. The timing functions in the receiver are performed by the clock and these resettable divide-ty-two circuits.

41 Claims, 17 Drawing Figures

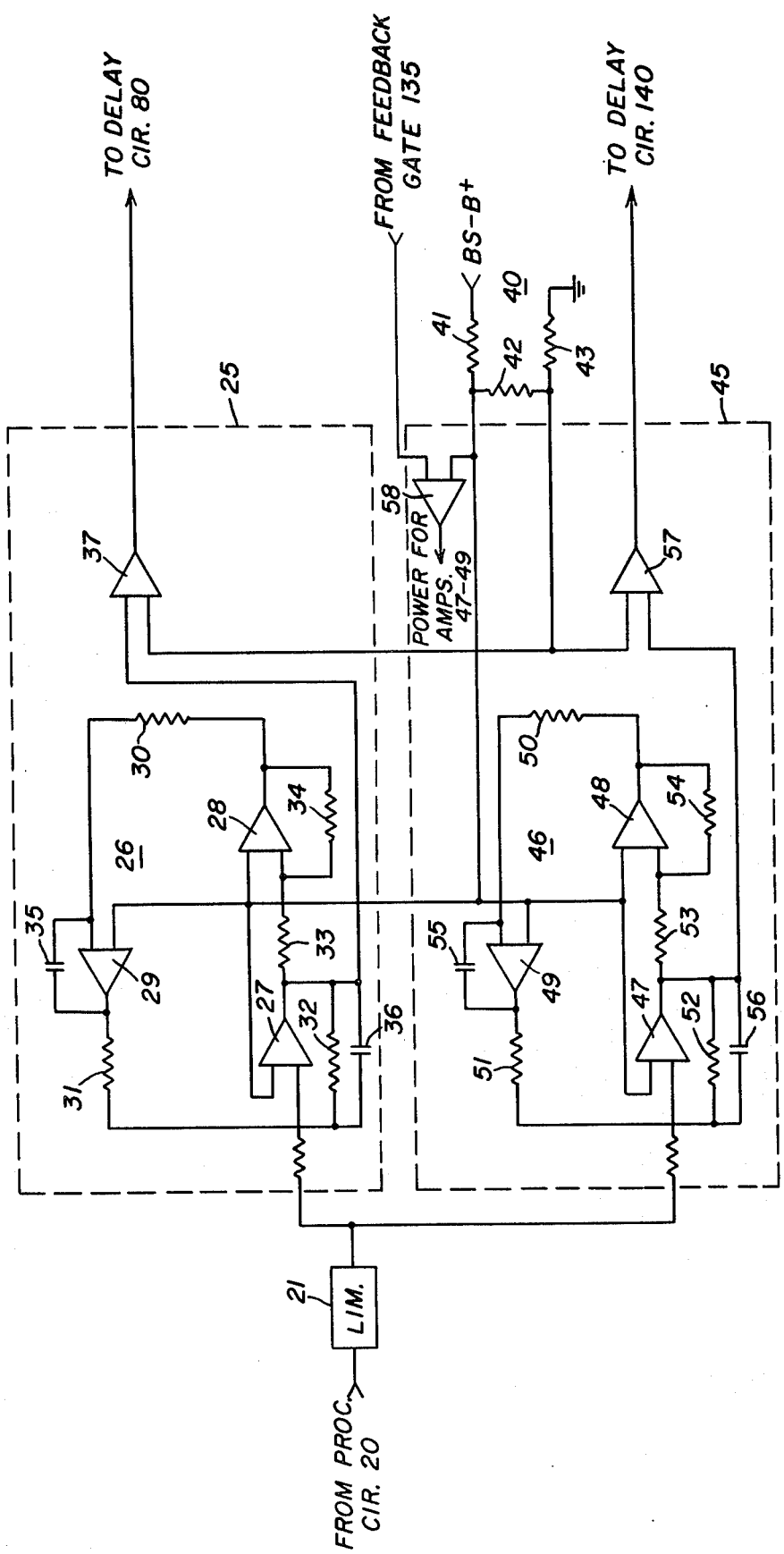

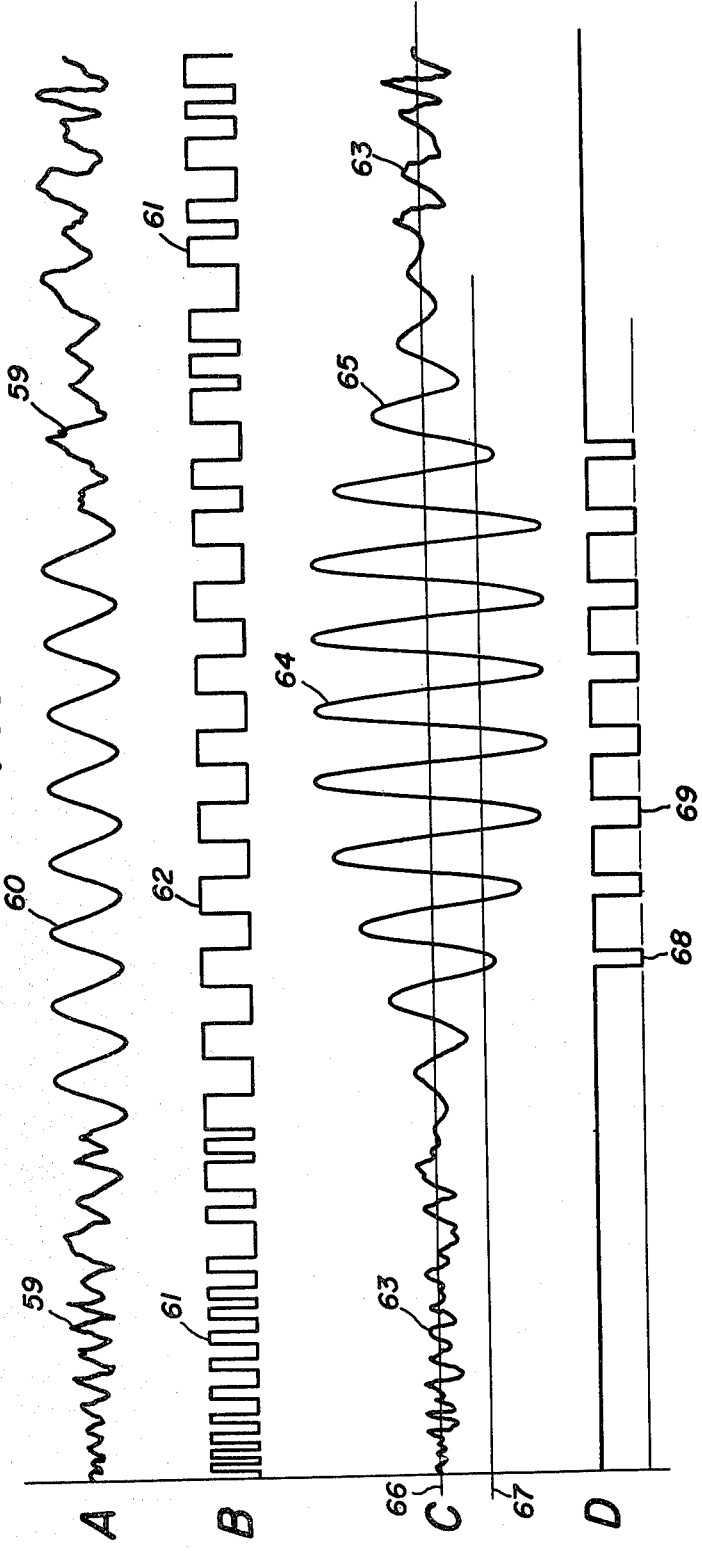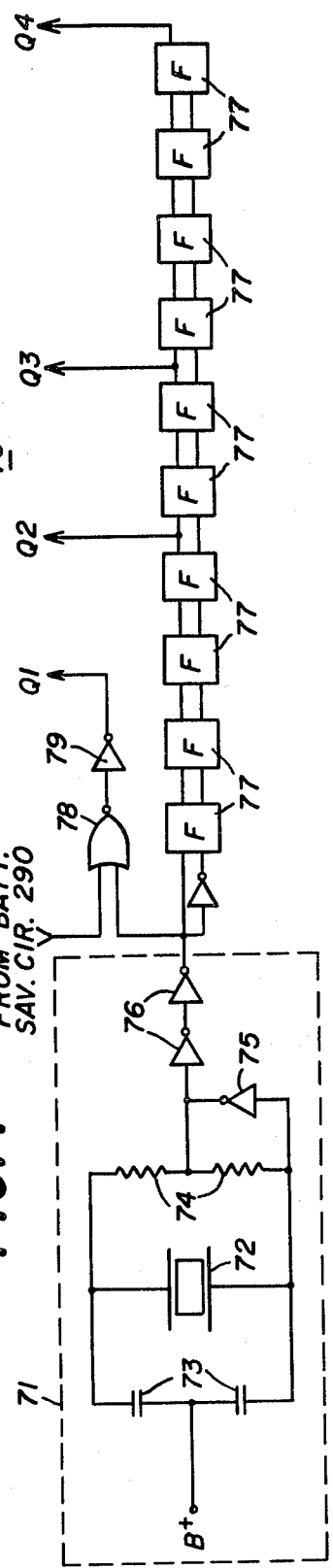

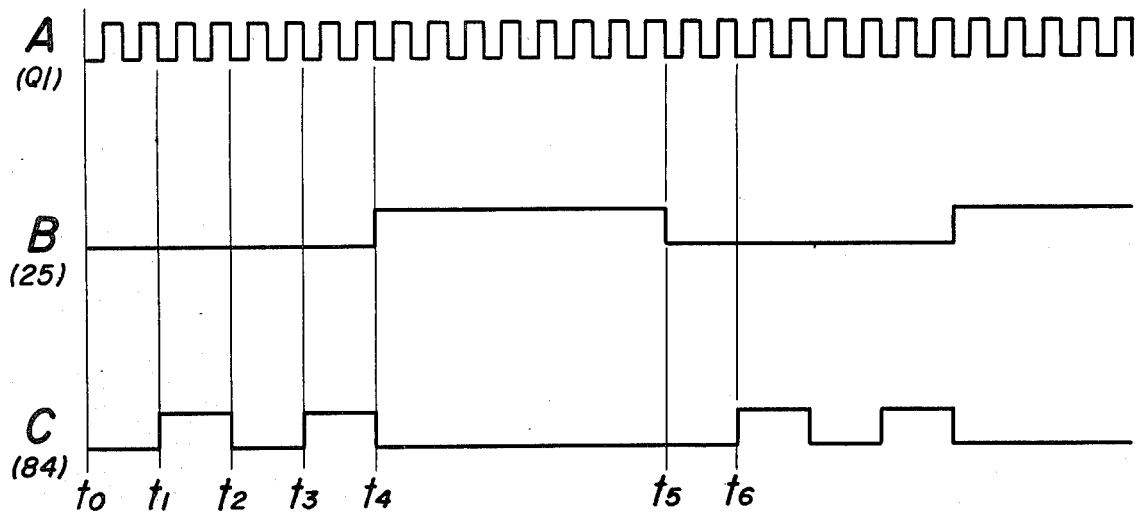
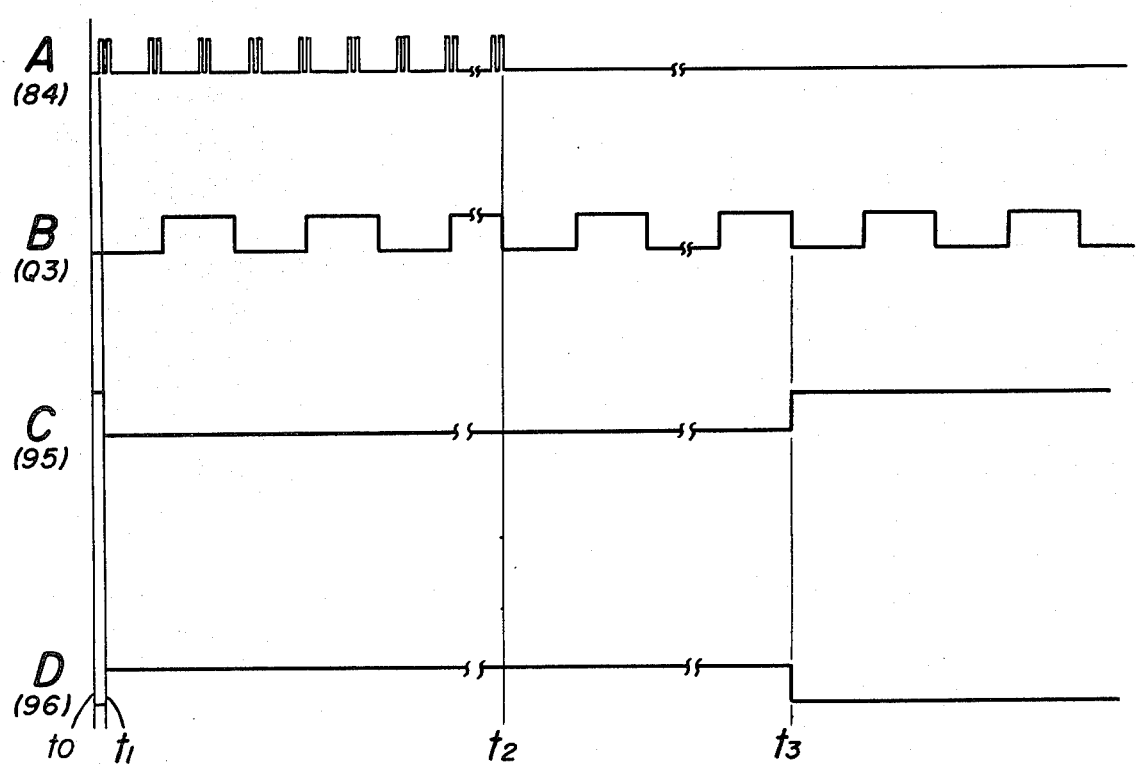

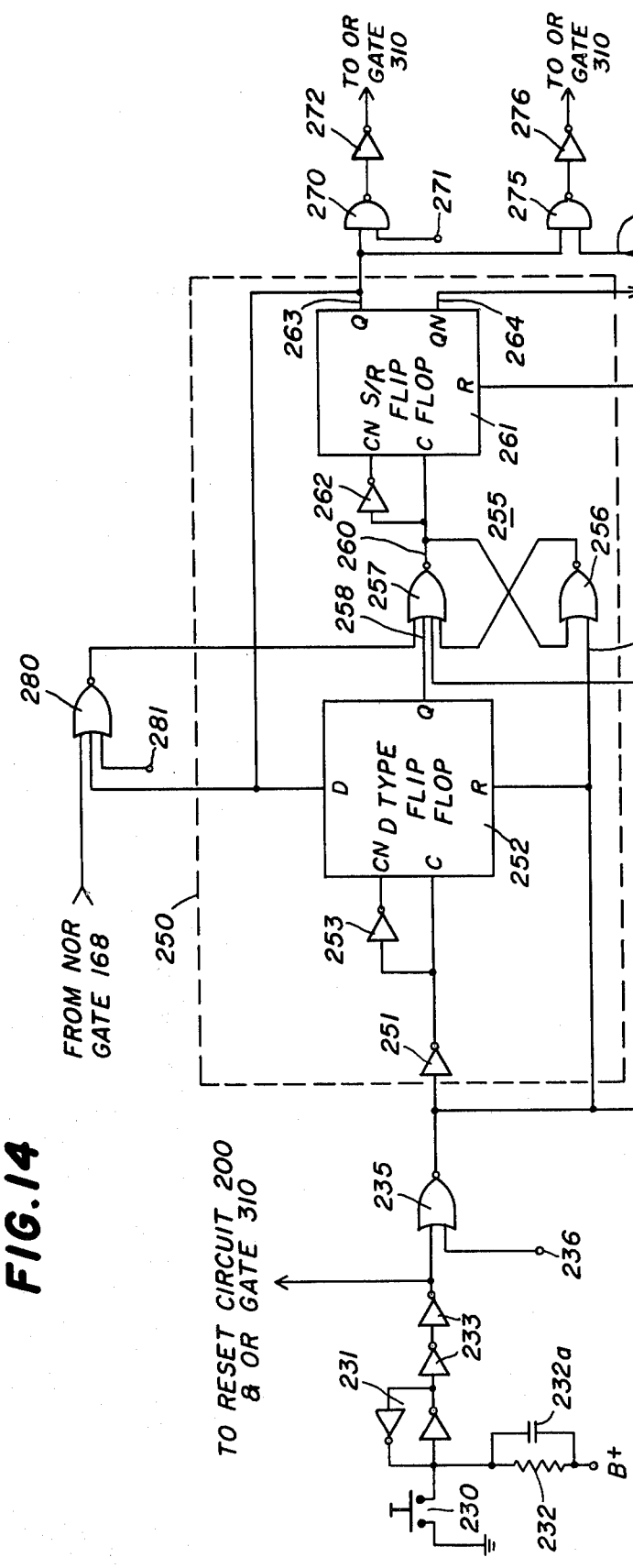
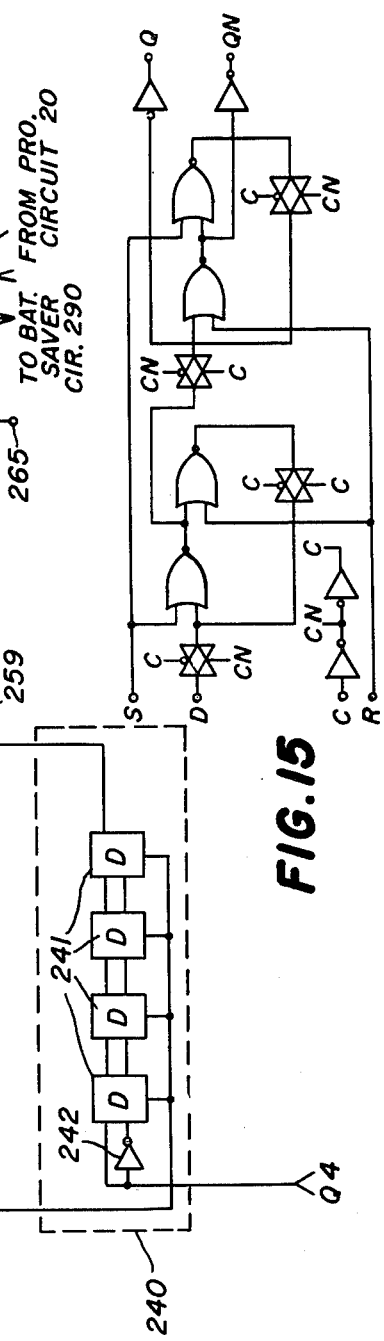
FIG. 14
FIG. 15

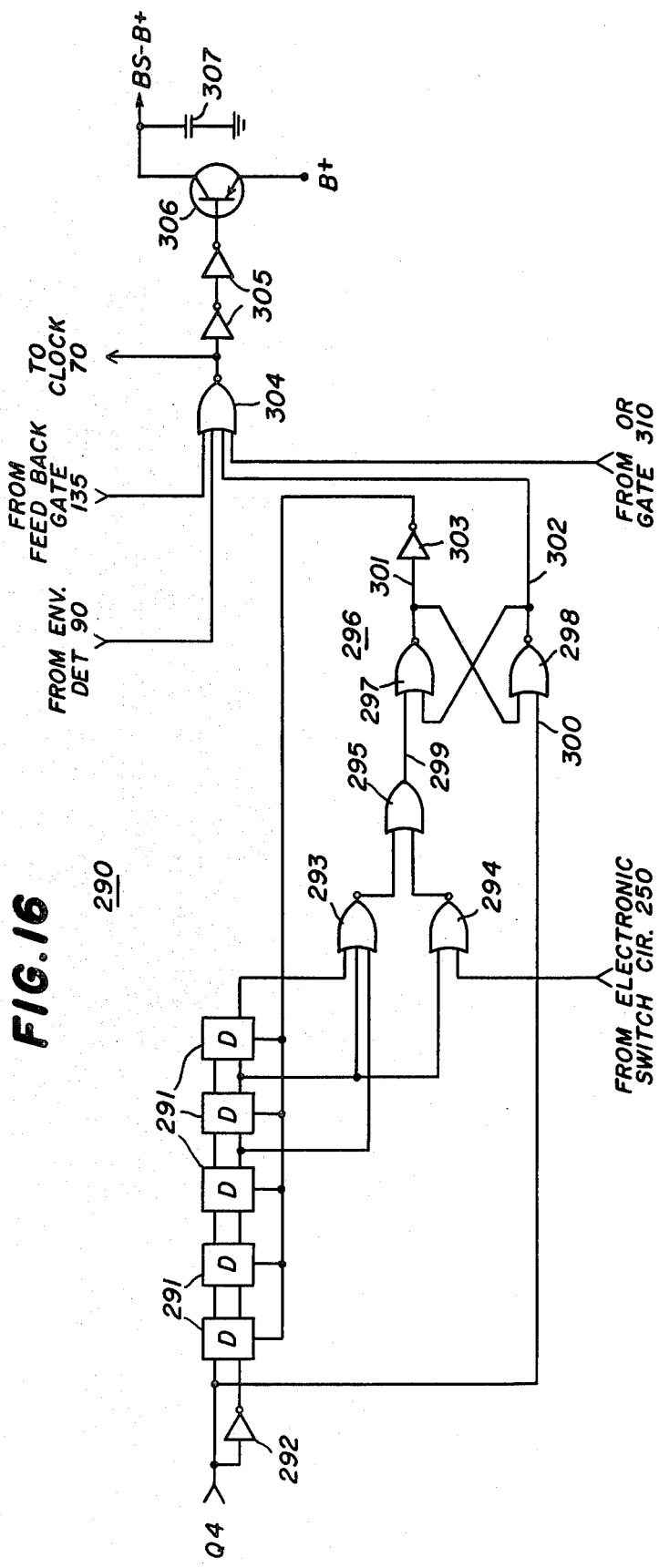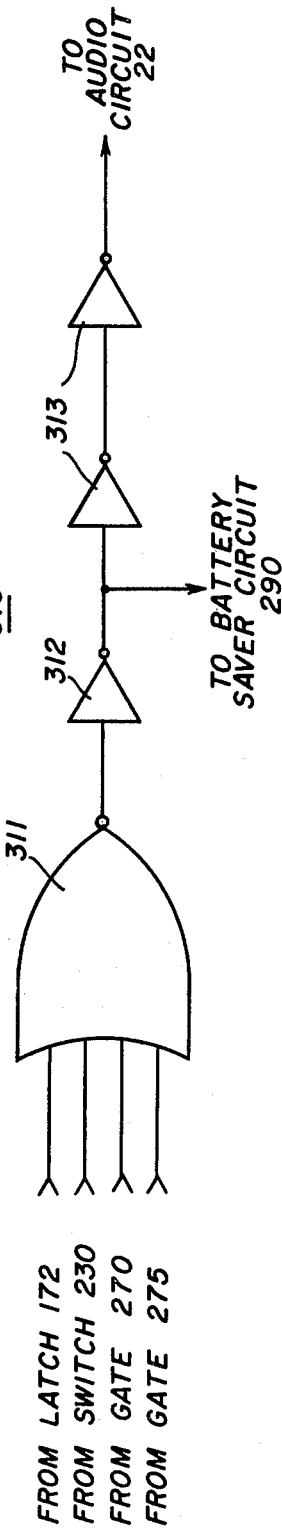

SELECTIVE CALL COMMUNICATION RECEIVER

REFERENCE TO RELATED APPLICATION

This is a division of application Ser. No. 46,510, filed June 7, 1979, now U.S. Pat. No. 4,385,398.

BACKGROUND OF THE INVENTION

A selective call communication system comprises a transmitter and a number of receivers. Each receiver or pager is designed to intercept the same carrier wave, but its audio circuitry is rendered operative only when the carrier wave is modulated by a predetermined code. Upon reception of such code, the receiver produces an audible or visual alerting signal. In certian kinds of systems, the signal is followed immediately by a voice message. In others, no voice message is transmitted. The possessor of the latter type, upon being alerted, will perform some previously agreed upon action such as calling his office.

Usually a selectively called receiver will automatically turn off or become "squelched" after a communication to it has been completed. It will become reactivated only upon reception of that same code. In the interim, other receivers are being called in sequence and the communications with such receivers are not being heard by the first-mentioned receiver.

There are situations when the receiver having been once enabled by the correct code should remain indefinitely enabled to reproduce all communications on the channel. In other words, it should become carrier squelched and reproduce all communications on the carrier wave corresponding to that receiver, irrespective of whether they are preceded by the proper code. For other users of the system, and perhaps for the same user at other times, the receivers should remain code responsive.

In the past, there have been receivers which will respond to a predetermined code and then automatically become carrier squelched to reproduce all modulation on the channel. Such a receiver is disclosed in U.S. Pat. No. 3,613,004 which issued to one of the applicants named herein. If the carrier wave to the receiver described therein is interrupted it will revert to its code-squelch mode.

Motorola's MINITOR alert monitor has a switch that allows the user to select between a carrier-squelch mode and a tone-squelch mode. When the switch is in the position corresponding to the latter, the proper code will activate the receiver and also cause it to change to the carrier-squelch mode, in which mode all transmissions on the channel will be heard. The receiver will be squelched or quieted between transmissions. A separate reset bar is actuated to cause the alert monitor to revert to the tone-squelch mode. The alert monitor can be placed in its carrier-squelch mode manually by placing the select switch in its other position. Thus, the MINITOR alert monitor requires two separate manual switches to place the receiver into, and take it out of, the tone-squelch and carrier-squelch modes. Furthermore, the MINITOR alert monitor has no means to become unsquelched indefinitely so that the receiver output is continuously on.

In Motorola's PAGECOM radio pager, reception of the proper code unsquelches the receiver completely so that it is on all of the time; i.e., it becomes a monitor. The pager may then be reset at any time so that subsequent communications are detected only if preceded by the proper code. However, the PAGECOM pager has no means to enable manual placement in this mode.

Neither the MINITOR alert monitor nor the PAGECOM radio pager are programmable in one way so that the button can be used to place the receiver into and take it out of the carrier-squelch mode, or programmable in another way so that the button can be used to place the receiver into, and take it out of, the monitor mode.

Communication receivers of the kind described in this application are portable and therefore incorporate batteries as the source of power. The batteries may be rechargeable (such as nickel-cadmium) or throw away (such as mercury). Rechargeable batteries are much more expensive, larger and perhaps heavier than their counterpart throw-away batteries of equivalent capacity. A rechargeable batter must be replaced from time to time since it eventually will wear out. Also, rechargeable batteries must be frequently taken out of service in order to charge them. On the other hand, throw-away batteries must be replaced often, and, therefore, their use is likely to be more expensive. In order to use throw-away batteries, it has been proposed to increase their useful lives by reducing the power consumed by the receiver. Battery saver circuits in the past have accomplished this by delivering pulsed power to the various circuits in the receiver until a message for that receiver is received, at which time the power becomes continuous.

Carriers-operated battery saver circuits cause power to be delivered to the receiver continuously whenever the carrier wve is present. When the receiver is part of a system on a busy channel the carrier wave is present much of the time and battery life is, therefore, not prolonged very much. In receivers with code-operated battery saver circuits, power is continuously applied only when a code for that particular receiver is received. Such a receiver will consume substantial power only when its code is being received and for the duration of the ensuing voice message. Some additional power will be consumed by the receiver while it is receiving a proper first tone even if the code is not meant for it. One such battery saver circuit is disclosed in U.S. Pat. No. Re. 28,022, the patentee of which is one of the applicants herein.

In tone-operated battery saver circuits, the pulses of power are spaced apart as much as possible in order to minimize power consumption. However, in order to be sure the pager will respond to its code consisting of a sequence of tones, the first tone must have a duration longer than the time between pulses. When such a receiver is converted to one that is carrier squelched after having received a proper code, as described above, it is undesirable for the pulses of power to be so far apart. The initial part of an ensuing voice communication would be lost to the extent it fell between such pulses. If the time between pulses was say 1.75 seconds to increase battery life, then up to 1.75 seconds of conversation could be lost because the receiver would not have continuous power at such time.

A further consideration in the design of battery saver circuits is the duration of the pulses. Since it is during those pulses that the receiver is consuming power, it is desirable to minimize their durations. However, those pulses must be long enough to insure that when the first tone of a possibly correct code is received, it will be detected and an output produced to cause the battery saver to provide continuous power for at least a time. In the past, detection of the first tone has taken too long so that the duration of the pulses produced by battery saver circuits were unduly long.

In certian selective call comunication systems, a sequence of sinusoidal tones at predetermined frequencies is modulated onto the carrier wave. In each receiver, the modulation components are separated from the carrier. wave and a sequence of sinusoidal tones is provided. The tones are normally limited; that is, the tones are converted into a square wave. The square wave is applied to a set of filters, or a sequentially tunable filter, which provides a sinusoidal output if the input tones have the frequencies and are in the order to which the particular receiver is designed to respond. In the past, the sine wave was applied to a detector which included an RC integrating circuit and provided an output when its amplitude exceeded some threshold. U.S. Pat. No. 3,613,004 cited above discloses such a detector. The time between inception of the tone and detection thereof varied depending on precise values of the resistance and capacitance in the detector. Also, the extent of precision of the tuning of the filter, the particular tone frequency, supply voltage variations, and noise content in the signal, all affected the time between tone inception and detection. The tones used in systems with receivers having such a detector must be long enough to take care of the longest time lag which might be encountered.

The processor circuit, which includes the RF input circuit, local oscillators, IF stages and the demodulator, produces noise spikes and other glitches which may include frequency components on the frequency of the decoder filters so as to be coupled therethrough. Delay circuitry prevents the spike or glitch from being reflected in circuitry down the line. Each tone, on the other hand, has a duration greater than the delay, so that it will be reflected in subsequent circuits. In the past, such delay circuits injected more delay than needed, in order to compensate for tolerances in the decoder components and for the effect of variations in temperature and supply voltage. Since the noise spikes and other glitches commonly are on the order of twenty microseconds or less in duration, more delay was unnecessary. In receivers with battery saver circuits, it is important as explained previously, that detection of the first tone occur quickly in order that the battery saver pulses can be as narrow as possible. The delay caused by these prior-art delay circuits requires longer battery saver pulses.

Initially, there were two basic kinds of pagers available: tone-only pagers which emitted an alerting tone when paged and tone-and-voice pagers which emitted an alerting tone when paged, followed by a voice message. In the case of a tone-only pager, the alerting tone would tell the person wearing the pager to perform some previously agreed upon action. Later, pagers were developed which could perform in a tone-only mode or in a tone-and-voice mode depending on the character of the code applied thereto. U.S. Pat. No. 4,019,142, in which the patentee is one of the present applicants, discloses such a pager.

Also, it became clear that a single alerting tone did not convey enough information. For example, in certain instances a caller may wish to tell the wearer of a pager to call his office, and in other instances the caller may wish to tell him to call his home. Pagers were developed to furnish different alerting tones in accordance with the nature of the code applied thereto.

In Motorola's METRO-PAGEBOY radio pager, for example, an interrupted alert tone is emitted when a preamble and five tones are received by the pager. A continuous alert tone is emitted when the preamble and six tones are received. This necessitates an additional code tone to create the different alerting tone.

An alternative scheme is disclosed in U.S. Pat. No. 3,686,635 to Millington et al. In the pager described in this patent, a standard two-tone sequence causes an interrupted alerting tone to be generated, and when it is desired to make a group call, a longer single tone is sent which causes the pager to generate a continuous alerting tone. The Millington et al. pager does not have means to provide a selectively called pager with one of a plurality of alerting tones or to be converted to a tone-and-voice pager.

U.S. Pat. No. 4,019,142 discloses a receiver which responds to different durations of a code tone to display numbers corresponding to the code or to switch automatically between a tone-only mode and a tone-and-voice mode. The receiver disclosed therein does not provide different alerting tones in accordance with the durations of the tones in the code itself.

In this kind of receiver, a tone in the code can have one of several durations. Therefore, it is important that the receiver be capable of accurately and consistently distinguishing one from the other. Otherwise, a code tone of given duration which is supposed to cause an alerting tone of certain characteristics will instead cause production of a different alerting tone. This aspect is of particular concern if the possible durations are not very different.

The circuitry in U.S. Pat. No. 4,019,142 which detects the tone duration is RC in nature and, therefore, is not capable of distinguishing, with high accuracy, between different, but closely related, durations.

A pager has as many channels as there are tones in the code. The first channel is normally operative while the rest are normally inoperative. When the first tone is received, the first channel develops an output to render the second channel operative so that it can process the second tone. The second channel then develops an output to render the third channel operative so that it can process the third tone, and so forth. It has been learned that there are several advantages to be gained by rendering operative a normally inoperative channel only on termination of the preceding tone. For example, the second channel would become operative only after the first tone has terminated, not during the first tone. Such operation is disclosed in U.S. Pat. No. 2,929,921 to Clark, Jr. and also in the above-mentioned '004 patent. In each case, an RC circuit in the output of the first channel produces an enabling signal to turn on the second channel for a predetermined time.

It is desirable that the "window" (the time during which the second channel is operative) be as short as possible in order to minimize the possibility of a particular pager responding to another tone which appears to correspond to its second tone, but is, in fact, part of speech or the code for some other receiver. The window must be long enough so that the second channel can detect the second tone. The timing circuits disclosed in these two patents being RC in nature must compensate for tolerances in the components and for temperature and supply voltage variations. The window was therefore longer than needed.

Generally, resistors and capacitors in timing circuits render it impractical to integrate them. In other words, usable capacitive elements cannot readily be formed in an IC. Instead, capacitors must be connected externally to ICs in order to provide adequate timing capability.

Circuits which time digitally offer the very substantial advantage of being integrateable. Certain timing functions in selective call communication receivers have in the past been performed digitally. For example, in Motorola's METRO-PAGEBOY pager, digital timing is employed. However, the METRO-PAGEBOY pager does not use digital timing for delay, envelope detecting, duration detecting, timing of the "window" for enablement of a second channel, and other timing functions.

Selective call communication receivers which are responsive to two or more tones are often responsive to a long first tone in order to enable communication with a group of them. However, such receivers are not readily modifiable to a single-tone receiver, it being desirable, in certain instances, to use a single-tone system comprising many single-tone pagers.

SUMMARY OF THE INVENTION

It is therefore an important object of the present invention to provide an improved selective call communication receiver which is normally unsquelched by a proper code and thereafter is unsquelched by just the carrier wave.

Another object is to provide a single switch which is usable to set a selective call communication receiver into a carrier-squelch mode and to reset the receiver back to a tone-squelch mode.

Another object is to provide a single switch to convert a tone-squelch receiver into a monitor receiver and vice versa.

Another object is to provide a selective call communication receiver which is normally in a tone-squelch mode but by way of a simple internal connection may be converted so that operation of an associated switch will selectively place it in a mode in which it is unsquelched by the carrier and in a mode in which it is first unsquelched by a code and thereafter by a carrier.

Another object is to provide a selective call communication receiver which is normally in a tone-squelch mode but by way of a simple internal connection may be converted so that operation of an associated switch will selectively place it in a mode in which it is unsquelched continuously (i.e., it becomes a monitor) and in a mode in which it is unsquelched by the code.

Another object is to provide an improved battery saver circuit for a selective call communication receiver in which the time between pulses is maximized, while minimizing the chances of failing to detect speech.

Another object is to provide an improved battery saver circuit for a selective call communication receiver, in which the duration of the "on" pulses is kept to a minimum.

Another object is to provide an improved battery saver circuit which produces during standby widely spaced-apart pulses of power for a selective call communication receiver, a continuous supply voltage during the reception of the code and the intelligence thereafter, followed by pulses at a more rapid rate.

Another object is to provide a clock for a digitally timed selective call communication receiver, which is rendered intermittently inoperative during standby to minimize battery drain.

Another object is to reduce the time required to detect the presence of a tone applied to a selective call communication receiver, without rendering it more susceptible to falsing.

Another object is to provide a short time delay, precise and consistent in response to each code tone, so that the decoder is nonresponsive to glitches, yet the duration of each code tone can be short.

Another object is to render a selective call communication receiver nonresponsive to glitches, without consuming excessive air time and without affecting battery saver performance.

Another object is to provide a selective call communication receiver which is responsive to a code consisting of a sequency of tones, in which the duration of the last tone controls the characteristics of an alerting tone produced by such receiver.

Another object is to provide a decoder for a selective call communication receiver which is responsive to a sequence of two tones and in which the second channel of the decoder is normally inoperative and is rendered operative upon termination of the first tone for a minimum duration in order to minimize falsing.

Another object is to provide aselective call communication receiver which has an alert-tone generator to produce an alerting tone in the presence of a predetermined code, which alert-tone generator is decoupled from the audio amplifier so as not to load same while voice messages are being transmitted.

Another object is to detect rapidly the presence of a code tone so that the duration of the code tone can be minimized and/or so that the duration of the code "on" pulses provided by a battery saver circuit can be minimized.

Another object is to provide a selective call communication receiver in which almost all of the components of its decoder and battery saver circuitry are in an integrated circuit.

Another object is to provide decoder and battery saver circuitry for a selective call communication receiver which uses only digital circuits for timing.

Another object is to provide very accurate timing of the various functions in the decoder of a selective call communication receiver.

Another object is to provide a selective call communication receiver which is unsquelched by a code consisting of a sequency of tones, but which can be modified by making a simple internal connection to make it a single-tone receiver.

In one aspect of the invention there is provided the combination comprising filter means responsive to a code tone of predetermined frequency to provide a sinusoidal wave, means for converting the sinusoidal wave into a train of tone pulses, and means responsive to the first of the tone pulses exceeding a predetermined duration to provide an output signal.

In another aspect of the invention there is provided the combination comprising a source of clock pulses, a source of a train of tone pulses at the frequency of the code tone, the source of tone pulses being susceptible of producing an extraneous pulse of a duration less than a predetermined value, and delay means having a clock input coupled to the source of clock pulses and a reset input coupled to the source of tone pulses, the delay means being rendered operative by the train of tone pulses to divide the frequency of the clock pulses by a factor M, the value of M and the frequency of the clock pulses being selected to cause the delay means to produce an output signal a time after commencement of the train of tone pulses equal to the predetermined value, whereby the output signal is produced only when the duration of the tone pulses exceeds the predetermined value.

In another aspect of the invention there is provided the combination comprising a source of clock pulses, a source of a train of tone pulses persisting substantially for the duration of the detected code tone, and envelope detector means having a clock input coupled to the source of clock pulses and a reset input coupled to the source of tone pulses, the envelope detector means being reset by each of the tone pulses and being rendered operative therebetween to divide the frequency of the clock pulses by a factor N, the value of N and the frequency of the clock pulses being selected to cause the envelope detector means to produce a control signal when no tone pulse has been produced by the source thereof for a time equal to a predetermined value, whereby no output pulse is produced as long as the gap between successive tone pulses is less than the predetermined value.

In another aspect of the invention there is provided the combination comprising means for producing a control signal persisting substantially for the duration of the detected code tone, a source of clock pulses, duration detector means having a clock input coupled to the source of clock pulses and a reset input coupled to the producing means, the duration detector means being rendered operative by the control signal and for the duration thereof to divide the frequency of the clock pulses by a certain factor, which factor and the period of the clock pulses are selected to cause the duration detector means to produce an output signal only when the control signal exceeds a predetermined duration.

In another aspect of the invention, there is provided the combination comprising means for producing a control signal persisting substantially for the duration of the detected code tone, enabling means responsive to the termination of the control signal to initiate an enabling signal, and reset means responsive to the beginning of the enabling signal to produce a reset signal a predetermined time after such initiation, the enabling means being responsive to the reset signal to terminate the enabling signal, thereby to cause the enabling signal to commence substantially with termination of the code tone and to last for the predetermined time.

In another aspect of the invention, there is provided the combination comprising normally operative tone means responsive to a first detected code tone of perdetermined frequency for providing a control signal persisting substantially for the duration of the first detected code tone, a source of clock pulses, duration detector means having a clock input coupled to the source of clock pulses and having a reset input coupled to the normally operative tone means and having first and second outputs, the duration detector means being rendered operative by the control signal for the duration thereof to divide the frequency of the clock pulses by first and second factors respectively associated with the first and second outputs, the values of the factors and the period of the clock pulses being selected to cause the duration detector means to produce a first output signal on the first output when the control signal exceeds a first predetermined duration and a second output signal on the second output when the control signal exceeds a second longer predetermined duration, normally inoperative tone means coupled to the first output and being rendered operative by the first output signal and then being responsive to a second detected code tone of predetermined frequency for providing a third output signal, and utilization means coupled to the second output and to the normally inoperative tone means and being operative to use the second output signal or the third output signal.

In another aspect of the invention, there is provided the combination comprising normally operative tone means responsive to a first detected code tone of predetermined frequency for providing a control signal persisting substantially for the duration of the first detected code tone, a source of clock pulses, duration detector means having a clock input coupled to the source of clock pulses and having a reset input coupled to the normally operative tone means and having first and second outputs, the duration detector means being rendered operative by the control signal for the duration thereof to divide the frequency of the clock pulses by first and second factors respectively associated with the first and second outputs, the values of the factors and the period of the clock pulses being selected to cause the duration detector means to produce a first output signal on the first output when the control signal exceeds a first predetermined duration and a second output signal on the second output when the control signal exeeds a second longer predetermined duration, the duration detector means including gate means having a control input selectively connectable to an enabling voltage and having a signal input coupled to the second output, the gate means being operative to produce a gate signal in the presence of the second output signal when an enabling signal is applied to the control input, normally inoperative tone means coupled to the first output and being rendered operative by the first output signal and then being responsive to a second detected code tone of predetermined frequency for providing a third output signal, and utilization means coupled to the gate means and to the normally inoperative tone means and being operative to use the gate signal or the third output signal.

In another aspect of the invention, there is provided the combination comprising decoder means coupled to the processor circuit and being responsive to a set of detected code tones respectively of predetermined frequency to provide a control signal for a duration related to the duration of the one detected code tone, duration-detector means coupled to the decoder means and responsive to the control signal for providing output signals representative of the duration of the one detected code tone, clock means for producing a clock signal at an audio frequency, and control means coupled to the duration-detector means and to the clock means for producing one of two or more alerting tones having characteristics and durations corresponding to the detected signals, the alerting tones being coupled to the transducer.

In another aspect of the invention there is provided the combination comprising clock means for producing a clock signal at an audio frequency, means having an input coupled to the processor and an input coupled to the clock means and two outputs and being responsive to a predetermined code for producing an operating signal on one of the outputs and an alerting tone on the other of the outputs, and gate means having an output coupled to the audio circuit and having first and second inputs coupled respectively to the first and second outputs, the output of the gate means floating in the absence of an operating signal on the first input thereof to unload the audio circuit during the presence of the intelligence signals, the gate means being operative for the duration of the operating signal on the first input thereof the couple to the transducer the alerting tone on the second input thereof.

In another aspect of the invention, there is provided the combination comprising manually operable switch means operable between first and second positions, timer means coupled to the manually operable switch means and being responsive to the switch means being in the second position for at least a predetermined time to provide a timer signal, electronic switch means coupled to the manually operable switch means and to the timer means and being responsive to the concurrence of the timer signal and the manually operable switch being in the second position to provide an indefinitely extending enabling signal for the audio circuit, the electronic switch means being responsive to subsequent operation of the manually operable switch means to terminate the enabling signal.

In another aspect of the invention, there is provided the combination comprising manually operable switch means operable between first and second positions, timer means coupled to the manually operable switch means and being responsive to the switch means being in the second position for at least a predetermined time to provide a timer signal, electronic switch means coupled to the manually operable switch means and to said timer means and to the decoder circuit and being normally in a first switch condition, the electronic switch means being responsive to the concurrence of the timer signal and the manually operable switch being in the second position to be placed in a second switch condition for an indefinite period of time, the electronic switch means being also responsive to the decoder circuit being in the second decoder condition to be placed in the second switch condition for an indefinite period of time, the electronic switch means reverting to the first switch condition in response to subsequent operation of the manually operable switch means, and gate means having a control input coupled to the electronic switch means and a signal input coupled to the processor circuit and being responsive to the concurrence of a squelch signal and the electronic switch means being in the second switch condition to provide a gate signal to enable the audio circuit.

In another aspect of the invention, there is provided the combination comprising switch means normally in a first switch condition and being placeable in a second switch condition, battery saver means for producing a pulsed supply voltage for at least part of the processor circuit, the battery saver means being coupled to the decoder circuit and being responsive to the second decoder condition to provide a continuous supply voltage for a period of time, the battery saver means being coupled to the switch means and being responsive to the second switch condition thereof to reduce the rate of the pulsed supply voltage after the period of time.

In another aspect of the invention, there is provided the combination comprising a decoder circuit coupled to the processor circuit and being normally in a first decoder condition and being responsive to a predetermined code to be placed in a second decoder condition, the decoder circuit including timer means for evaluating the code and clock means for producing a clock signal for the timer means, and battery saver means for producing a pulsed supply voltage for at least part of the processor circuit, the battery saver means being coupled to the decoder circuit and being responsive to the second decoder condition to provide a continuous supply voltage for the processor circuit, the clock means including an electronic switch coupled to the battery saver means and being responsive to the pulsed supply voltage to cause the clock signal to be applied intermittently to the timer means and being responsive to the continuous supply voltage to couple the clock signal continuously to the timer means.

The invention consists of certain novel features and a combination of circuits and circuit elements hereinafter fully described, illustrated in the accompanying drawings, and particularly pointed out in the appended claims, it being understood that various changes in the details may be made without departing from the spirit, or sacrificing any of the advantages of the invention.

BRIEF DESCRIPTION OF THE DRAWINGS

For the purpose of facilitating an understanding of the invention, there is illustrated in the accompanying drawings, preferred embodiments thereof, from an inspection of which, when considered in connection with the following description, the invention, its construction, and operation, and many of its advantages should be readily understood and appreciated.

FIG. 2 is a diagram partially in block and partially in schematic of the frequency discriminators in FIG. 1;

FIG. 3 depicts wave forms at several of the points in the diagram of FIG. 2;

FIG. 4 is a diagram partially in block and partially in schematic depicting the clock of FIG. 1;

FIG. 6 depicts wave forms in the delay circuits of FIG. 5;

FIG. 7 depicts wave forms in the envelope detectors of FIG. 5;

FIG. 14 is a block diagram of the electronic switch circuit and related gates in FIG. 1;

FIG. 15 is a block diagram of the flip-flop circuits of FIG. 14;

FIG. 16 is a block diagram of the battery saver circuit of FIg. 1; and

FIG. 17 is a block diagram of the OR gate of FIG. 1.

DETAILED DESCRIPTION OF THE PREFERRED EMBODIMENT

Figure 1:
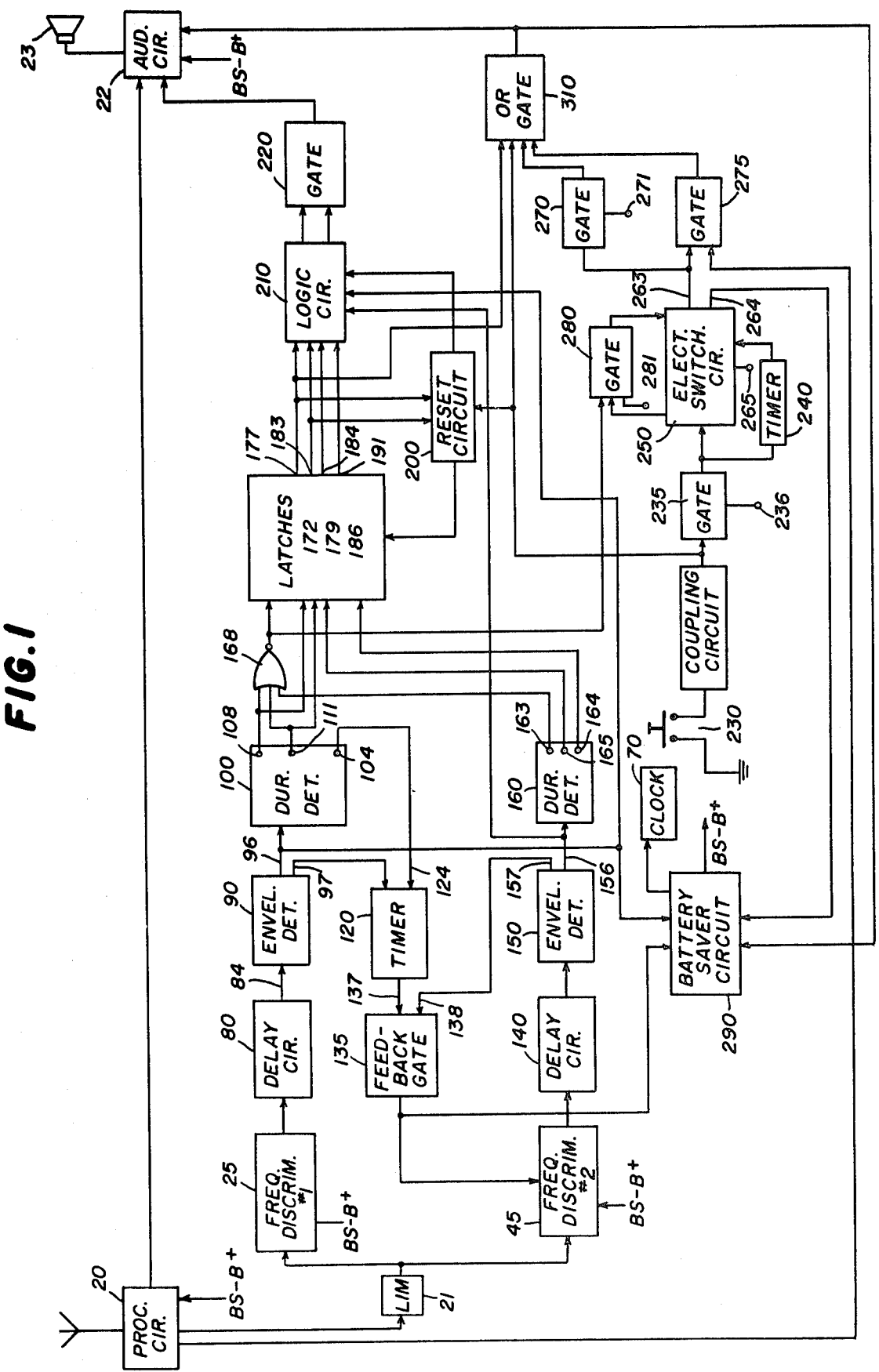
FIG. 1 is a block diagram of a communication receiver incorporating the features of the present invention.

Referring now to FIG. 1, there is shown a communication receiver made in accordance with and embodying the principles of the present invention. The receiver is basically selective call in nature, meaning that it is generally squelched or inoperative. If it receives a predetermined code, it will become unsquelched and communication can be made. The receiver may be "tone only" or "tone and voice" depending on the character of the code. In "tone only" operation, the particular code to which the receiver is designed to respond will cause it to generate an audible alerting tone. The receiver, when operated as tone only, can produce one of two kinds of alerting tones, one continuous and one interrupted. The person wearing such receiver will perform one agreed-upon action when he hears a continuous tone and some other agreed-upon action when he hears an interrupted tone.

Alternatively, the receiver can be operated as a tone-and-voice model, in which case the code to which the receiver is designed to respond will unsquelch the receiver and cause it to produce an alerting tone. In addition, the code will cause the receiver to be enabled for some additional period of time in order to reproduce an audio message sent by the transmitter.

The code consists of a sequence of tones of certain frequencies and order. The receiver is designed to respond to a sequence of two tones, although the principles are applicable to a sequence of as many tones as desired. With a two-tone sequence, each receiver in the system is programmed to respond to two tones of predetermined frequencies and in a certain order.

If the first tone is "long", then all receivers having a decoder responsive to that tone will all be called as a group. A short first tone will render operative the second channel so that it can evaluate the second tone. A medium length tone will unsquelch the receiver if an optional connection is made to convert the receiver to respond to a single tone.

The duration of the second tone will determine whether the receiver is to be operated as a tone-only model or as a tone-and-voice model. A medium-length tone will cause the receiver to be operated to produce a 4-second, continuous audible alerting tone, and a short tone will cause a 4-second interrupted alerting tone to be generated. A long second tone will cause the receiver to be operated as a tone-and-voice model in which a short "beep" is generated to alert the wearer of the receiver of the ensuing voice message. The voice message follows the beep.

The receiver is basically selective call in nature, that is, type I. However, this receiver is programmable to be one of two additional types:

II. A code-squelch/monitor type, in which the receiver is placeable in one of two modes:
 A. A code-squelch mode (type I receiver), and
 B. A monitor mode in which the receiver is unsquelched continuously to enable it to process any communications on the channel;

III. A code-squelch/carrier-squelch type, in which the receiver is normally code squelched. Reception of a code or manual operation of a switch causes the receiver to be unsquelched by and for the duration of communications on the channel.

The receiver is adapted to receive an RF carrier wave modulated by the code alone, or by the code followed by an audio message. The transmissions are intercepted by an antenna and are conveyed to a processor circuit 20 which includes the usual local oscillator(s), mixer(s) and demodulator. The demodulator (not shown) furnishes the code alone or the code followed by an audio message, as the case may be. The code portion is applied to a limiter 21 which increases the amplitude of the code to a fixed value. An audio circuit 22 amplifies an internally generated alerting tone applied thereto, and also the audio signals, if any. A loudspeaker 23 converts the audio signals into sound waves. Normally the receiver is squelched, in other words, the audio circuit 22 is disabled. Audio signals, noise and all other communication on the channel cannot be heard. In the presence of a proper code, the audio circuit 22 becomes enabled so that it can amplify the alerting tone and the audio signals, if present, and apply same to the loudspeaker 23.

An important aspect of the present invention is the reduction in drain on the batteries with which the receiver of FIG. 1 is used. The battery saver circuit 290 provides a pulsed supply voltage shown as "BS-B+". Periodically, say every 1.75 seconds, the supply voltage is present for a short period of time, say 30 milliseconds (ms.). During these 30 ms. intervals, the receiver is consuming power, and during the time between pulses virtually no power is being drained from the battery. The processor circuit 20, the audio circuit 22, and other circuits are supplied with the BS-B+ supply voltage. During the first tone and when a proper code is received, the battery saver circuit 290 is caused to produce a continuous supply voltage.

As explained, the code from the limiter 21 will usually be a sequence of two tones. The two-tone sequence is converted to a sequence of square waves, respectively at the frequencies of the tones which are applied to the frequency discriminators 25 and 45. The frequency discriminator 25 includes filter means responsive to a train of tone pulses at a predetermined frequency to provide a sinusoidal output wave, which is then reconverted into a train of tone pulses. Similarly, the frequency discriminator 45 includes filter means responsive to a code tone of predetermined frequency to provide a sinusoidal wave which is reconverted into a train of tone pulses. The frequency discriminator 25 is in the normally operative channel in the sense that it is operative to process the first code tone, while the frequency discriminator 45 is in the second channel, which is normally inoperative, so that it cannot process a tone to which it is designed to respond until it is activated by receipt of the first tone. Both of the frequency discriminators 25 and 45 are supplied by the BS-B+ supply voltage, meaning that negligble power is used by these elements (actually the amplitude is less than that—say ½—applied to the circuits 20 and 22), in the absence of the proper code.

The first pulse is produced by the frequency discriminator 25 very quickly, within a few milliseconds. It is this first pulse which will cause the battery saver circuit 290 to discontinue producing the pulsed supply voltage and commence producing a continuous supply voltage. It is desirable to minimize the duration of the battery saver pulses in order to minimize power consumption. However, the pulse must be long enough that the frequency discriminator 25 is enabled for a sufficient length of time to recognize a proper code. Because the frequency discriminator responds during just a few milliseconds, the pulses can be very short, say 10 ms.

The train of tone pulses from the frequency discriminator 25 is applied to a delay circuit 80 which is responsive to the first of the tone pulses from the frequency discriminator 25 to provide a signal on the output 84. That first tone pulse must be present for at least a predetermined duration (such as 30 microseconds) in order for the output signal to be generated. As a result, glitches and other extraneous signals, commonly having durations less than such predetermined duration, do not affect subsequent circuitry. Actually the output signal from the delay circuit 80 will be a train of modified tone pulses. Such modified pulses will be substantially for the duration of the first code tone. The train of pulses from the delay circuit 80 is applied to an envelope detector 90. The envelope detector 90 will produce on its output 96 a control signal commencing essentially with the start of the detected first code tone and terminating a short time after the end of that code tone, say 7 ms. later. If the carrier drops out, because of a weak signal, for example, then as long as it returns within that 7 ms. period, the control signal will continue. The duration of the control signal, therefore, will depend upon the duration of the code tone. The duration of the control signal would be up to 1.75 seconds less than the duration of the first code tone, depending upon the extent of coincidence between the start of a code tone and the occurrence of a battery saver pulse.

The duration of the control signal on the output 96 is evaluated by a duration detector 100. If the detected code tone is at least 62 milliseconds, an output signal will appear on the output 104, which is used to enable the second channel.

If it is desired to communicate with a group of receivers having the same first tone, then a very long first code tone of, say, 4.5 seconds, is sent, causing an output signal to appear on the output 108. If the receiver is programmed to respond to a single tone, then an output signal will appear on the output 111 when the code tone has some intermediate length, say, 2.5 seconds.

The output 104 is connected to one input of a timer 120, the second input of which is coupled to the output 97 of the envelope detector 90. The timer 120 produces an enabling signal commencing with the termination of the first tone and terminating a predetermined time later, such as 31 ms. This 31 ms. interval constitutes a "window" during which the second channel is enabled to determine if the second code tone is present. For that purpose, the enabling signal is coupled through a feedback gate 135 to the frequency discriminator 45. If no second tone is present during the 31 ms. window, the enabling signal terminates, so that the receiver is prepared to evaluate a subsequent code. However, if the second code tone has a frequency to which the frequency discriminator 45 is tuned, and such is received during the 31 ms. window, and the first tone pulse is present for a predetermined duration a delay circuit 140 will produce a train of pulses. An envelope detector 150 produces a control signal substantially for the duration of such pulses. The circuits 140 and 150 perform basically like the circuits 80 and 90 in the first channel. Oppositely poled control signals will appear on the outputs 156 and 157 for the duration of the second code tone. The output 157 is coupled to the feedback gate 135 to cause the enabling signal to be present, and thus to maintain the second channel enabled, for the duration of the second tone instead of just for the duration of the window.

The other control signal is applied to a duration detector 160, which has three outputs 163, 164 and 165. If the second code tone is short, say, between 31 ms. and 125 ms., an output signal will appear on the output 163. Output signals appear on the outputs 163 and 164 when the second code tone has a medium duration, say, between 125 ms. and 250 ms. All three outputs become high when the second code tone has a long duration, say, one exceeding 250 ms.

The output signals on the outputs 163, 164 and 165 are applied to latches 172, 179 and 186, the modes of which will affect which of the outputs 177, 183, 184 and 191 have signals thereon. A reset circuit 200 resets all three latches simultaneously one of two predetermined times after they have been set, say, 4 seconds and 10 seconds. The latches will be reset in 4 seconds in response to a second tone having a duration less than 250 ms. The latches will be reset in 10 seconds, if the second code tone has a duration greater than 250 ms.

There is provided a logic circuit 210 coupled to the latches 172, 179 and 186 and responsive to the plurality of modes thereof to produce operating signals of various durations on one output and alerting tones of various characteristics on a second output. The duration of the operating signal from the logic circuit 210 as well as the character of the alerting tone produced thereby are dependent upon which of the latches 172, 179 and 186 have been set, and which is in turn dependent upon the duration of the second code tone. The logic circuit 210 also receives a low frequency signal of, say, 4 Hz. from the reset circuit 200.

In the presence of a second code tone having a duration greater than 250 ms., the logic circuit 210 will produce an operating signal for the duration of the second code tone and will produce a 2 KHz. alerting tone for such duration. In the presence of a medium length second code tone, the operating signal from the logic circuit 210 will be present for 4 seconds and the alerting tone will be continuous and have a frequency of 2 KHz. Finally, when the second code tone has a short duration, then the operating signal will still be 4 seconds in length, but the 4 Hz. signal from the reset circuit 200 will cause the logic circuit 210 to produce an interrupted alerting tone in which each burst is 125 ms. in duration and there is 125 ms. between bursts.

A gate circuit 220 will be operative for the duration of the operating signal from the logic circuit 210 to couple to the audio circuit 22 the alerting tones described above. When the duration of the code tone is less than 250 ms. then the enabling signal furnished by the OR gate 310 is 4 seconds long, corresponding to the duration of the alerting tone produced by the gate circuit 220. The audio circuit 22 is therefore enabled for a 4-second interval so that the alerting tone will be coupled to the speaker 23. The user will know that if he hears the continuous 4-second tone he is to perform one act, while if he hears the 4-second interrupted ("beep-beeps"), then he will perform some other act.

If the second code tone is long, then the latch 172 will have been set for 10 seconds, and the audio circuit 22 becomes operative for 10 seconds. The gate circuit 220 produces a continuous alerting tone lasting for the several hundred milliseconds duration of the second tone. Thereafter, the second tone terminates but the audio circuit 22 remains operative for 10 seconds to reproduce the intelligence signals. In other words, when he actuates the base station, the code is sent to a particular receiver with which he wishes to communicate which automatically turns it on for 10 seconds and causes it to produce a short alerting tone. The alerting tone ends when the two-tone transmission ends and the audio circuit 22 can immediately begin translating the audio message.

After 10 seconds, the latches become reset as previously explained and the audio circuit 22 becomes disabled. There are provided means to maintain the audio circuit 22 operative beyond this time if the audio message lasts longer. Partly for this purpose, there is provided a switch 230, the output of which is coupled through a Schmitt trigger 231 to the OR gate 310. When the switch 230 is closed, a signal is applied to one of the inputs of the OR gate 310 which is reflected in the output thereof to maintain the audio circuit 22 operative and to maintain the power continuous. Thus, the balance of the message can be heard. The switch 230 can also be used to monitor the channel. Even without having had a previous communication, the user may close the switch 230 and listen to communications on the channel. Operation of the switch 230 will also simultaneously cause the reset circuit 200 to reset the latches 172, 179 and 186 and thereby cause discontinuance of the alerting tone and continue the operating signal. In other words, after the switch 230 is operated, the audio circuit 22 is no longer under the influence of the latches 172, 179 and 186.

In the absence of a code, no operating signal is applied to the gate 220 and its output is floating. Thus, before and after the alerting tone is generated, the gate 220 creates no load on the audio circuit 22.

The audio circuit 22 will react to a group call or to a single tone when the receiver is programmed to respond to a single tone, in the same way that it responds to a long second tone. In other words, the audio circuit 22 will be rendered operative for a relatively long duration (10 seconds) and will produce an alerting tone for the few milliseconds corresponding to the duration of the first code tone.

Thus far the receiver has been described as being programmed to be type I in which the receiver is unsquelched by the code for a predetermined time after the code has ended. Electronic switch circuit 250 and associated gates 235, 270, 275 and 280 enable the receiver to be used as types II or III. The gate 235 has a control terminal 236, which is one of four terminals in the receiver that can be selectively connected to enabling voltages to establish the receiver type. When the terminal 236 is not connected to an enabling voltage, the receiver is programmed to be type I; normally squelched, and unsquelched by the proper code. To program the receiver to be type II or type III, the control terminal 236 is connected to an enabling voltage so that actuations of the switch 230 are reflected in the output of the gate 235. The output of the gate 235 is coupled to a timer circuit 240 and also to the electronic switch circuit 250. The electronic switch circuit 250 has a control terminal 265 which is selectively coupled to an enabling voltage and is only operative in the presence of such enabling voltage. The gate 270 has a control terminal 271 and is operative only in the presence of an enabling voltage on such terminal. The outputs of the gates 270 and 275 are coupled to the remaining inputs of the OR gate 310. The gate 280 has one input constituting a control terminal 281, another input coupled from the gate 168, and a third input coupled from the electronic switch circuit 250. The output of the gate 280 is coupled to the electronic switch circuit 250. Without an enabling signal on the control terminal 281, the gate 280 is inoperative.

When the receiver is programmed to be a code-squelch type (type I), the terminals 236, 265, 271 and 281 are not connected to enabling voltages, whereby the gates 235, 270 and 280 and the electronic switch circuit 250 are inoperative. Then, actuation of the switch 230 performs in the manner described previously.

If it is desired to program the receiver to be a code-squelch/monitor type (II), then the terminals 236, 265 and 271 are connected to enabling voltages. When so programmed, the receiver is initially in its code-squelch mode. In other words, the receiver is normally squelched. It is unsquelched when the proper code is received. Thereafter, the receiver is automatically squelched again and is unsquelched only when a subsequent proper code is received. However, when the receiver is programmed to be of this type, it can be manually placed in a monitor mode by closing the switch 230 for at least a predetermined time, such as 0.5 second, causing the electronic switch circuit 250 to switch conditions. One of the switch outputs is used to control the battery saver circuit 290 in a manner to be described shortly. The other is applied to the gates 270 and 275. Because the control terminal 271 is connected to an enabling voltage, such output is coupled through the gate 270 to the OR gate 310 which provides an enabling signal for the audio circuit 22. Thus, as soon as the switch 230 is depressed, audio is heard and if actuated for more than 0.5 second, the audio circuit 22 is rendered operative continuously and indefinitely to reproduce any communications on the channel. To take the receiver out of its monitor mode, and return it to its code-squelch mode, the switch 230 is closed, causing the electronic switch circuit 250 to switch conditions again and discontinue the output supplied to the gate 270 and thereby terminate the enabling signal applied to the audio circuit 22.

In order to program the receiver to be a code-squelch/carrier-squelch type (III), the control terminals 236, 265 and 281 are coupled to enabling voltages. When so programmed, the receiver is initially in its code-squelch mode. In other words, the receiver is normally squelched, and unsquelched when the proper code is received. After the code is completed and the time out period following the code, the receiver is automatically squelched and is unsquelched subsequently whenever carrier is received by way of signals from the processor circuit 20 coupled to the gate 275.

The receiver can be placed in its carrier-squelch mode either by receipt of a proper code or by actuating the push-button switch for more than 0.5 second. The receiver will thereafter be unsquelched by just the carrier wave whether or not a code is received. Subsequent actuation of the switch 230 will reset the receiver to its code-squelch mode.

The battery saver circuit 290 produces a pulsating signal in which the pulses last 31.25 ms. and there is an interval of 1.75 seconds between pulses. This constitutes the pulsed power BS-B+ for the various elements of the receiver including the processor circuit 20, the audio circuit 22, and others.

Signals on the inputs to the battery saver circuit 290 cause the pulsating B+ supply voltage to stop, and be replaced by a continuous supply voltage. First, the output 96 of the envelope detector 90 is normally low, but as soon as the first code tone is detected, such output becomes high and stays high for the duration of that tone, causing the BS-B+ supply voltage to become continuous. Such continuous supply voltage maintains the processor circuit continuously operative to process subsequent code tones. The output of the envelope detector 90 becomes high very quickly upon detection of the first tone, within several ms. so that the battery saver pulses can be short in duration.

On termination of the first tone, the output of the feedback gate 135 becomes high and stays high for a 31.25 ms. window enabling analysis of the second tone by the second channel in the decoder circuit. Thus, the supply voltage is maintained continuous for this additional 31.25 ms. by virtue of the output of the feedback gate 135 being coupled to the battery saver circuit 290. If the receiver does not receive the proper second tone, then the output from the feedback 135 will again become low, and the circuit 290 will again produce a pulsating supply voltage.

On the other hand, if the second tone is received, the output of the feedback gate 135 is maintained high for the duration of that tone so that a continuous supply voltage to the processor circuit 20, the audio circuit 22 and other circuits in the receiver, is maintained for the duration of the second tone.

The battery saver circuit 290 also receives an input from the OR gate 310, the output of which is high whenever the audio circuit is enabled. Thus, even though the feedback gate 135 output becomes low upon termination of the second tone, the fact that the audio circuit 22 has been enabled as the result of several causes, will maintain the supply voltage continuous. When the audio circuit 22 is disabled, then the battery saver circuit 290 will revert to producing the pulsating supply voltage for the receiver.

An important aspect of the present invention is the ability of the battery saver circuit 290 to produce the pulsating voltage at a more rapid rate when the receiver is in its carrier squelch mode. The output 264 of the electronic switch circuit is normally low. When the receiver has been programmed as a type III, and has been placed in its carrier-squelch mode either by operating the push button switch 230 or by receipt of a proper code and a carrier wave is then received the output 264 becomes high which causes the battery saver circuit 290 to produce a pulsating supply voltage in which the pulses are 31.25 ms. wide and the interval between pulses is reduced to 0.5 second. In other words, the processor circuit 20, the audio circuit 22, etc. are operated more often.

When a communication is subsequently sent on the channel, the carrier wave will immediately unsquelch the receiver, render the audio circuit 22 operative to amplify the ensuing voice message.

The OR gate 310 has four inputs respectively coupled to the latch 172, the switch 230, the gate 270 and the gate 275, and has its output coupled to the battery saver circuit 290 and to the audio circuit 22. All four inputs to the OR gate 310 are normally low so that its output is normally low. Thus, under normal conditions the audio circuit 22 is disabled and the receiver is squelched.

In the presence of any proper code, the output 177 of the latch 172 becomes high, whereby the output of the OR gate 310 becomes high causing the battery saver circuit 290 to produce a continuous supply voltage for the duration of such code and for a certain time thereafter, (4 or 10 seconds depending upon the character of the code). Likewise, the audio circuit 22 is enabled for such period of time.

The second input is derived from the switch 230, through the Schmitt trigger 231 (FIG. 14). When the switch 230 is closed, the output of the OR gate 310 becomes high to cause the battery saver circuit 290 to provide a continuous voltage again for as long as the switch is closed. Furthermore, the audio circuit 22 is enabled for that duration.

The third input to the OR gate 310 is from the gate 270. If the associated control terminal 271 is connected to an enabling voltage, then the output of the gate 270 becomes high until it is reset. Thus, the battery saver circuit 290 is caused to produce a continuous supply voltage and the audio circuit 22 is caused to be continuously on until the switch 230 is operated.

The last input to the OR gate 310 is derived from the gate 275. When placed in the carrier-squelch mode, this input becomes high when, and for the duration that, the carrier wave is present. The carrier wave will thus cause the battery saver circuit 290 to produce a continuous supply voltage and will cause the audio circuit 22 to be continuously operative.

Turning now to FIG. 2, further details of the frequency discriminators 25 and 45 will be described. As previously explained, the processor circuit 20 develops a sequence of two sinusoidal waves respectively corresponding to the code tones which were modulated on the carrier wave. The processor circuit 20 separates the code tones from the rest of the signal. These sinusoidal waves are applied in sequence to the limiter 21 which provides a square wave or train of tone pulses at the frequency of the first code tone, followed by a second square wave or train of tone pulses at the frequency of the second code tone. The frequency discriminator 25 responds to a train of tone pulses at a predetermined frequency. The discriminator 25 includes an active band-pass filter 26, the elements of which are three operational amplifiers ("op amps") 27, 28 and 29, resistors 30–34, and capacitors 35 and 36. By controlling the values of the resistors 30–34 and the capacitors 35 and 36, the center frequency and Q of the active band-pass filter 26 can be controlled. The filter 26 has a high Q and will permit passage of the limited signal from the limiter 21 when the signal contains frequency components within the filter pass bands. The filters in the various receivers in the system will be tuned to different center frequencies. In an actual embodiment of this invention, the resistor 31 was used as the element to establish the center frequency of the filter 26, although other components could be used for that purpose.

The frequency discriminator 25 further includes a comparator 37 having its signal input coupled to the output of the filter 26, specifically the output of the op amp 27. The comparator 37 has its reference input connected to a source of reference voltage which will be described shortly. The output of the comparator 37 is normally high. When the voltage on the signal input exceeds the voltage on the reference input, the output of the comparator 37 becomes low. In this application, the term "high" is intended to mean a voltage at or near the B+ supply voltage, while the term "low" is intended to mean a voltage at or near ground reference potential. It is understood that these are merely exemplary and are intended to distinguish one state from another state. Those skilled in the art will recognize that ready modification may be made to convert an input or an output which is high to one which is low, and vice versa.

The op amps 27, 28 and 29 are preferably on a single IC chip and each have two terminals (not shown) adapted to be connected respectively to ground and B+. The B+ terminals of the op amps 27, 28 and 29 are connected to the battery saver circuit 290 so as to receive a pulsating supply voltage. The frequency discriminator 25 is said to be in the normally operative channel, meaning that it is normally in condition to determine if a code tone has the frequency to which the active filter 26 is tuned. However, the active filter 26 is only operative during the supply voltage pulses to evaluate the frequency of a code tone from the limiter 21. Accordingly, the filter 26 is only drawing current from the receiver battery during a very small part of the time the receiver is on.

Bias for the op amps 27, 28 and 29 is also in the form of a pulsating supply voltage. For this purpose, a voltage divider 40, defined by a set of three resistors 41, 42 and 43 in series, is connected between the pulsating B+ supply voltage and ground. The junction of the resistors 41 and 42 is connected to the bias inputs of the op amps 27, 28 and 29. The values of the resistors 41, 42 and 43 are preferably such that the bias on these bias inputs is about one-half the B+ supply voltage, so that the sinusoidal wave produced by the filter 26 in response to the train of tone pulses from the limiter 21, will swing essentially between the B+ supply voltage and ground.

In order that the comparator 37 draw a minimum of current during standby, its reference voltage is also pulsating. Specifically, the junction of the resistors 42 and 43 is connected to the reference terminal of the comparator 37. The reference voltage is less than the DC bias on the op amps 27, 28 and 29, preferably 0.3 to 0.4 volt less than such voltage.

During standby, noise, commonly referred to as "white noise" is inherently produced by the processor circuit 20 which noise is reflected as an input to the frequency discriminator 25. The reference voltage for the comparator 37 is established at a level below the noise peaks so that noise passing through the filter 26 does not affect the comparator 37.

When frequency of the train of tone pulses produced by the limiter 21 matches the frequency of the filter 26, then the input to the comparator 37 exponentially builds to a level exceeding (in this instance, crossing in a negative direction) the reference voltage whereupon the comparator 37 produces a pulse. The output of the comparator 37 is normally high and becomes low whenever, and for the duration that, the sinusoidal wave from the filter 26 exceeds the reference voltage. The comparator 37 will produce a square wave or train of tone pulses at the frequency of the code tone. An important advantage of the "bi-quad" configuration of the discriminator 25 is its resistance to ringing when pulsed.

The frequency discriminator 45 includes basically the same elements as the frequency discriminator 25 and to enable ready comparison the reference numeral used in the former have 20 added to the corresponding reference numerals used in the frequency discriminator 25. The element that may be varied to establish the center frequency of the filter 46 is the resistor 51. The filter 46 is part of the normally inoperative channel and does not respond to any tone until the tone of the proper frequency has been processed by the filter 26. For example, if a receiver is designed to respond to code AB, the second channel will not be able to process tone "B" until after tone "A" has been received and terminated. For this purpose, the ground terminal of each of the op amps 47, 48 and 49 is connected to the output of a comparator 58. The reference input of the comparator 58 is connected to the junction of the resistors 41 and 42 and its signal input is coupled to the feedback gate 135. Normally the output of the comparator 58 is high so that the op amps 47, 48 and 49 are disabled and the filter 46 is not operative.

The comparator 58 draws negligible current during standby because its reference voltage is pulsating. The reception and termination of a first code tone will cause the feedback gate 135 in the first channel to apply a B+ voltage to the comparator 58, which exceeds the reference voltage thereon, causing the output of the comparator 58 to become low thereby enabling the op amps 47-49. If, at that time, there is present at the output of the limiter 21 a code tone corresponding to the frequency to which the filter 46 is tuned, the same will be coupled therethrough. The output of the comparator 57 is normally high and will become low whenever the sinusoidal wave from the filter 46 exceeds the reference established at the junction of the resistors 42 and 43.

Turing now to the wave forms shown in FIG. 3, further details of the frequency discriminators 25 and 45 will be described. FIG. 3A depicts a wave form appearing at the input of the limiter 21. It consists of white noise 59 followed by a code tone 60, followed again by the white noise 59. The noise 59 which is produced by the processor circuit 20 in the absence of a carrier wave, has components within a broad frequency range. The code tone 60 is a sinusoidal wave at the frequency to which the filter 26 is designed to respond.

FIG. 3B illustrates the wave form at the output of the limiter 21. Thus, the white noise 59 produces irregular rectangular waves 61 and the sinusoidal code tone 60 produces a square wave or train of tone pulses 62 at the frequency of the code tone 60. FIG. 3C depicts the wave form appearing at the output of the active band pass filter 26, namely on the output of the op amp 27. The broad band rectangular wave 61 contains a small amount of energy within the pass band of the filter 26, and, therefore, an irregular, low amplitude wave 63 appears during the presence of the white noise. When the tone 60 commences, assuming it matches the frequency of the filter 26, the filter output builds up exponentially to provide a wave 64. The wave 64 remains at its maximum, until the tone 60 terminates, whereupon the wave decays exponentially as at 65. The irregular pattern 63 following the wave 64 represents the output during the white noise 59. The wave 64 is centered about a DC bias voltage 66 derived from the junction of the resistors 41 and 42 (FIG. 2). Preferably such DC voltage bias is one-half the B+ supply voltage so that the wave 64, when it reaches its maximum, will swing between 0 and the B+ supply voltage. A few tenths of a volt below the bias voltage 66 is a reference voltage 67 derived from the junction of the resistors 42 and 43.

As shown in FIG. 3D, the output of the comparator 37 is normally high. When and as long as the signal from the filter 26 exceeds the reference voltage 67, the output of the comparator 37 becomes low. The first pulse 68 in the wave form 3D is narrow because the wave 64 exceeds the reference voltage 67 for a short time as it is building up. The time that it exceeds the reference voltage 67 during each cycle steadily increases during the build-up period. When the wave 64 reaches its maximum amplitude, the pulses 69 produced by the comparator 37 will have a substantially square configuration; that is, it will be high and low for substantially equal periods of time. When the code tone terminates and the wave 64 decays, the pulse duration will again decrease until the amplitude of the wave 64 is less than the reference voltage 67, whereupon the output of the comparator 37 stays high.

It is important to note how quickly the discriminator 25 detects the presence of a tone. For example, it produces a pulse 68 during the second cycle as can be seen in FIG. 3. If the lowest frequency to which the frequency discriminator 25 is designed to respond is say 500 Hz., the first pulse 68 is generated in 7-15 ms. or so depending on how much noise is in the signal. It is this first pulse which (by way of intermediate circuitry) causes the battery saver circuit 290 to discontinue producing a pulsed supply voltage and commence producing a continuous supply voltage. Each battery saver pulse must be long enough to insure detection of the first tone. Because the discriminator 25 produces a pulse 68 within say 5 ms. of the inception of the first code tone, and the duration of each battery saver pulse can be very short, say 10 ms. in duration to compensate for tolerances and the like.

The reference voltage 67 is less than the amplitude of the wave 63 representing the white noise, so that noise does not result in an output from the comparator 37. The closer the DC reference voltage is to the bias voltage 66, the faster the first pulse 68 will be produced by the comparator 37. Accordingly, the reference voltage 67 is set just low enough so that it is not activated by noise. The wave forms at various points in the frequency discriminator 45 are basically the same as those shown in FIG. 3. The DC bias of the filter 46 is the same as that of the filter 26. Similarly, the reference voltage for the comparator 57 is the same as that for the comparator 37. In both cases, a tone pulse is produced within a few milliseconds after the commencement of the proper tone.

Most of the rest of the circuits in FIG. 1 perform some timing function. The timing functions are performed digitally to minimize the need for capacitors which would normally be required. Also, digital timing enables the circuitry to be designed as an integrated circuit. Finally, digital timing offers more exact timing so that tolerances necessary for circuit components can be tightened and more rapid detection attained.

FIG. 4 depicts the clock 70 which furnishes clock signals for these various timing functions. The clock 70 comprises an oscillator 71 having a crystal 72, a pair of capacitors 73 coupled in series thereacross and a pair of resistors 74 also coupled in series across the crystal 72. An inverter 75 is connected across one of the resistors 74. In a particular embodiment of the invention, the oscillator 71 produced a pulsating signal at the frequency of 32,768 Hz. ($2^{15}$). The oscillator 71 is coupled by way of a pair of serially connected inverters 76 to a series of free running, divide-by-two stages 77. Each of the divide-by-two stages 77 is a standard flip-flop circuit having a clock input (C), a clock-not (CN) input, a Q output and a Q-not (QN) output. For simplicity, these inputs and outputs are labelled on the first stage 77 only. The C and CN inputs of each stage 77 are adapted to receive pulsating signals 180° out of phase with each other, and the Q and QN outputs produce pulsating signals 180° out of phase with each other at one-half the frequency of the pulses applied to the input of such stage. Thus, the C input of the first divide-by-two stage 77 receives the pulsating signal from the oscillator 71 directly and the CN input is coupled to an inverter so that the CN input is 180° out of phase with the C input. The first divide-by-two stage produces pulsating signals 16,384 Hz. at both the Q and QN outputs thereof, 180° out of phase with each other. In the receiver of FIG. 1, the outputs of four of the divide-by-two stages 77 are utilized: Q1, Q2, Q3 and Q4 respectively at 32,768 Hz.; 2,048 Hz., 512 Hz., and 16 Hz. The Q1 output is derived from a NOR gate 78 having one input coupled to the output of the oscillator 71 and the other input coupled to the battery saver circuit 290. The pulsating signal is inverted by an inverter 79. The NOR gate 78 is thus rendered operative only during pulses from the battery saver circuit 290 so that a 32,768 Hz. clock signal appears on Q1 only during the battery saver pulses. When the battery saver circuit is caused to produce a continuous supply voltage, the output of Q1 is continuous also. By producing a clock signal on the Q1 output only during the battery saver pulses, those circuits which utilize such clock signal draw a small fraction of the current that they would normally draw if they were counting continuously. The reset inputs (not shown) of all of the divide-by-two stages are connected low so that they are continuously dividing their inputs by two; i.e., they are free running.

Figure 5:
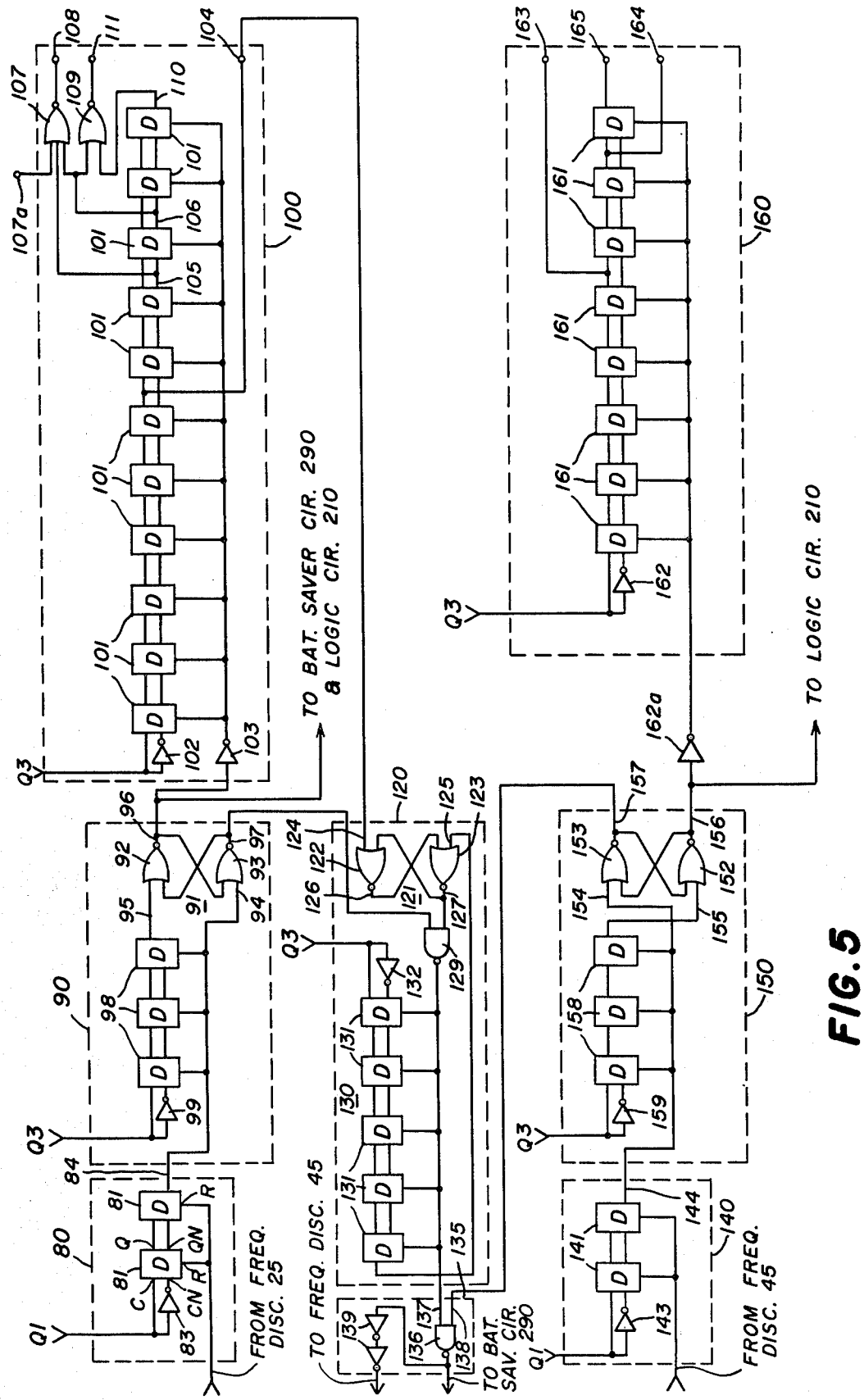
FIG. 5 is a block diagram disclosing details of the delay circuits, envelope detectors, timer and feedback gate in FIG. 1.

Turning now to FIG. 5, details of certain of the circuits of FIG. 1 will be described in greater detail. The sequence of tone pulses from the frequency discriminator 25 is applied to the delay circuit 80 which consists of a pair of cascaded, resettable, divide-by-two stages 81. Each of the divide-by-two stages 81 is of the same basic construction as the stages 77 in the clock 70. Each has a clock input (C), a clock-not (CN) input, a Q output, a QN output and a reset input R. The C and CN inputs of each stage 81 are adapted to receive pulsating signals 180° out of phase with each other, and the Q and QN outputs produce pulsating signals 180° out of phase with each other at one-half the frequency of the pulses applied to the inputs of such stage. The letter "D" is used to signify a divide-by-two stage which is not free running, since its reset input R is not always low. The reset inputs are connected together and to the output of the frequency discriminator 25. The Q1 clock signal is applied to the C input of the first divide-by-two stage 81. The Q1 clock signal is inverted by an inverter 83 and then applied to the CN input of the first stage 81. As long as the reset inputs R are low, the stage 81 will divide the Q1 clock signal by 4 ($2^2$). Only the Q output 84 of the second of the stages 81 is used, and, therefore, the QN output is not shown.

The Q output 84 of the second stage 81 is normally low and the reset input derived from the frequency discriminator 25 is normally high. A few milliseconds after commencement of the proper code tone, the frequency discriminator 25 output becomes low (note pulse 62 in FIG. 3D), at which time the divide-by-two stages 81 are operative to divide the Q1 clock signal by 4. If the Q1 clock signal is 32,768 Hz., then the frequency of the pulses on the Q output 84 will be 8,192 Hz. which, of course, has a period of 122 microseconds, or a half period of 61 microseconds. In other words, the output 84 which is normally low will first become high, 61 microseconds after the frequency discriminator 25 has commenced to detect the presence of a tone. Actually, 61 microseconds would be the maximum delay between detection of the first tone pulse and the time when the output 84 becomes high, assuming a Q1 clock frequency of 32,768 Hz. That delay could be as short as 30.5 microseconds depending upon the extent of coincidence between the start of a clock pulse and the inception of a pulse from the discriminator 25. If the output of the frequency discriminator 25 becomes low, simultaneously with the time the Q1 clock signal becomes low, then a maximum of 61 microseconds delay will be achieved, while if the clock signal becomes low just before the output of the discriminator 25 becomes low, then the minimum delay of 30.5 microseconds will occur.

Thus, the output 84 of the delay circuit 80 will become high between 30 and 60 microseconds (rounded off for convenience) after the output of the discriminator 25 has become low reflecting the presence of a tone. Thus, any signal having a duration less than about 30 microseconds will not be reflected on the output 84. Glitches and other extraneous signals commonly have durations less than 30 microseconds whereby ensuing circuitry would not be responsive to such glitches. Additional stages 81 may be used to provide additional delay if so desired.

During every other half cycle of the train of tone pulses from the discriminator 25 the input to the stages 81 will be high and the output 84 will be low. During the rest of the cycle, there will be present on the output 84, pulses at a frequency of 8,192 Hz. The number of pulses at such frequency depends upon the frequency of the code tone. At the low end of the range, say 500 Hz., there will appear on the output 84 about 8 pulses during every other half cycle of the tone while at the high end of the range, say at 2,700 Hz., 1½ pulses will appear during each half cycle. Whereas the signal from the frequency discriminator 25 is characterized as a train of tone pulses, the signal appearing on the output 84 of the delay circuit 80 is a train of modified tone pulses. Both reflect the frequency and the duration of the code tone.

Further details of the operation of the delay circuit 80 will be explained with reference to the wave forms shown in FIG. 6. FIG. 6A depicts the Q1 clock signal (shown in parenthesis) and FIG. 6B depicts the train of tone pulses from the frequency discriminator 25. For purpose of illustration, the frequency of the code tone is ¼ the clock frequency, or 2,048 Hz. In this illustration, it is assumed that the output of the frequency discriminator 25 becomes low precisely at the time the Q1 clock signal went low. The output 84 is shown in FIG. 6C and it starts low as shown. At $t_0$ the frequency discriminator 25 starts to detect the tone and its output becomes low as shown in FIG. 6B. The stages 81 begin to divide since their reset inputs are low. After a delay of two clock pulses, the output 84 becomes high at $t_1$ and remains high for an additional two clock pulses to $t_2$. Four pulses later, the output 84 as shown in FIG. 6C becomes high and returns to a low value at $t_4$. Between the tone pulses, starting at $t_4$, the output of the frequency discriminator 25 becomes high, and, therefore, the output 84 becomes low and stays low until $t_6$. At $t_5$, the signal from the frequency discriminator 25 becomes low, but the delay furnished by the delay circuit 80 causes the output 84 to become high at $t_6$, whereupon the cycle repeats itself. Thus, it may be seen that there will appear on the output 84 a sequence of pairs of pulses, as shown in FIG. 6C, the pairs being present at a rate corresponding to the frequency of the tone pulses from the frequency discriminator 25. If the frequency of the code tone decreases so that the period of the pulses from the frequency discriminator 25 increases, more of the pulses appear on the output 84. At 500 Hz., instead of pairs of pulses there will be groups of eight pulses, the groups repeating at a frequency of 500 Hz., that is, the frequency of the code tone. In each group of pulses, the frequency will remain constant at ¼ the Q1 clock frequency of 8,192 Hz., in the example. The signal on the output 84 reflects the code tone and the tone pulses from the frequency discriminator 25 and thus may be termed a sequence of modified tone pulses.

The frequency of the code tone affects the signal represented in FIG. 6C but in each case, the time $t_0$-$t_1$ is the same, whereby the delay from inception of the code tone, as represented by FIG. 6B, to the time when the output 84 first becomes high is constant and is 61 microseconds. If the Q1 clock signal was about to become low instead of just becoming low at $t_0$, the delay would be half of the time $t_0$-$t_1$ or about 30.5 microseconds.

Returning now to FIG. 5, the train of modified tone pulses on the output 84 is coupled to the envelope detector 90. One of the elements in such envelope detector is a latch 91 defined by a pair of NOR gates 92 and 93 connected in the usual way; namely, the output of the gate 92 is connected to one of the inputs of the gate 93, and the output of the gate 93 is connected to one of the inputs of the gate 92. The remaining input of the gate 93 is the set input 94 of the latch 91, and the remaining input of the gate 92 is the reset input 95 of such latch. The output of the gate 92 is the Q output 96 and the output of the gate 93 is the "Q-not" or QN output 97. The set input 94 is normally low so that the Q output 96 is normally low and the QN output 97 is normally high irrespective of the condition of the reset input 95.

Upon the occurrence of the first pulse from the delay circuit 80, the set input 94 becomes high, causing the latch 91 to switch states; the Q output 96 becomes high and the QN output 97 becomes low. The latch 91 is characterized by the fact that subsequent changes in the signal applied to the set input 94 have no effect on its state. Thus, the fact that the signal on the set input 94 oscillates between low and high values (FIG. 6C) has no effect. The latch 91 will remain set until the reset input 95 becomes high.

A signal for the reset input is developed by a series of three cascaded divide-by-two stages 98, the reset inputs of which are connected together and to the output 84 of the delay circuit 80. The C input of the first of the divide-by-two stages 98 is connected to the Q3 clock signal, while its CN input is connected through an inverter 99 to receive the same Q3 clock signal. The rest of the stages 98 have their C and CN inputs respectively connected to the Q and QN outputs of the preceding stage. The Q output of the last stage 98 is connected as the reset input 95 of the latch 91.

In the absence of any tone, the output 84 of the delay circuit 80 is low so that the reset inputs of all three divide stages 98 are low, whereby they are normally operative to divide the Q3 clock signal by 8 ($2^3$). Assuming the Q3 clock signal to be 512 Hz., there will be present on the reset input 95 of the latch 91 a pulsating signal at a 64 Hz. rate. The occurrence of a proper code tone causes the output 84 to become intermittently high which resets the divide stages 98. As soon as the output 84 becomes low, the divide stages 98 resume their dividing function. Thus, as soon as the proper code tone is received, the reset input 95 becomes low and the pulsating signal on the reset input 95 ceases. The pulses on the output 84 cause the stages 98 to be continually reset so that the reset input 95 remains low. About 7.8 ms. after termination of the tone, the output of the final divide stage 98 becomes high, which time is calculated as follows: The half period of the 512 Hz. clock signal is 0.977 ms. The three divide stages 98 produce a signal having a frequency one eighth as great and a half period eight times as great, or a half period of 7.8 ms. A time of 7.8 ms. assumes that the Q3 clock signal becomes low precisely at the time the output 84 of the circuit 80 becomes low. The time could be as short as 5.9 ms. if the two were properly phased. Thus, 5.9 to 7.8 ms. after the last pulse on the output 84, reflecting termination of the first code tone, the reset input 95 becomes high, producing an output pulse, which flips the latch 91 causing the Q output 96 to revert to its normally low condition and the QN output 97 to revert to its normally high condition. Thus, there appears on the outputs 96 and 97 oppositely poled control signals persisting for a duration substantially equal to the duration of the signal produced by the discriminator 25. It is "substantially equal" because the control signal commences thirty to sixty microseconds after the first code tone is detected and ends about 7 ms. (average of 5.9 and 7.8) after the first code tone ends.

The duration of the control signal is not likely to be the same as the duration of the code tone since that depends upon the extent of coincidence between the start of a code tone and the occurrence of a battery saver pulse. If they happened to be in coincidence, then the control signal will have a duration substantially the same as the duration of the first code tone. Much more likely, however, is that code tone will start at some time between battery saver pulses in which case, the code signal will have a duration somewhat less than the code tone. For example, if the first code tone had a duration of 1.9 seconds, the control signal could be as long as 1.9 seconds (less the tone detection time) if the inception of the first code tone took place simultaneously with the battery saver pulse. The control signal could be as short as 150 ms. if the code tone commenced immediately following a battery saver pulse, assuming 1.75 seconds between battery saver pulses. Similarly, if the code tone had a duration of 2.5 seconds, the control signal would have a duration of between 750 ms. and 2.5 seconds. A 4.5 second code tone would produce a control signal of between 2.75 seconds and 4.5 seconds.

If there is an interruption of pulses on the output 84 for less than 7 ms., the latch 91 will not be reset and the control signal will not terminate. When the receiver is used in a fringe area, so that the signal is very noisy, the tone may actually be lost in the noise and one or more pulses will be missing from the output 84. For a 500 Hz. tone, there is a pulse every 2 ms. At the other end of the spectrum, say 3,000 Hz., there is a pulse every 0.333 ms. Thus, as many as 3 to 4 pulses of a 500 Hz. code tone can be lost without interruption of the control signal. At 3,000 Hz., as many as 21 pulses can be lost.

Turning now to FIG. 7, further details of the operation of the envelope detector 90 will be explained by reference to the wave forms at the various points therein. FIG. 7A depicts the series of modified tone pulses on the output 84 (in parenthesis on figures) of the delay circuit 80, and is the same as the wave form in 6C but on a much smaller scale. FIG. 7B illustrates the Q3 clock signal. FIG. 7C depicts the wave form on the reset input 95 of the latch 91. As explained previously, the divide stages 98 are normally operating so that there appears on the reset input 95 a pulsating signal at a frequency of 64 Hz. Upon detection of the first code tone at $t_0$, the reset input 95 becomes low and stays low for the balance of the first code tone ($t_1$ $t_2$). FIG. 7D depicts the wave form on the Q output 96 of the latch 91. Initially, at $t_0$, it is low and at $t_1$, 60 microseconds later, it becomes high and remains high until the tone ends at $t_2$. About 7 ms. later, at $t_3$, the reset input 95 becomes high (FIG. 7C), causing the latch 91 to flip and the Q output 96 to become low (FIG. 7D). The control signal shown in FIG. 7D lasts substantially for the duration of the detected code tone. Actually it starts a short time after commencement of the tone (the time $t_0$-$t_1$) and ends after the end of the code tone (the time $t_2$-$t_3$). The output 96 remains low until the next code tone. At $t_3$, stage 98 reverts to producing a 64 Hz. pulsating signal.

Returning to FIG. 5, details of the duration detector 100 will be described. The duration detector 100 serves to determine the duration of the control signal from the envelope detector 90, which in turn means that the duration detector 100 is detecting the duration of the detected first code tone. The duration detector 100 includes eleven divide-by-two cascaded stages 101. The C input of the first divide stage 101 is connected to the Q3 clock signal, while its CN input is connected by way of an inverter 102 to the same clock signal. The C and CN inputs of each succeeding stage are connected respectively to the Q and QN outputs of the preceding stage. The reset inputs of all of the divide stages 101 are connected together and through an inverter 103 to the output 96 of the envelope detector 90. The Q output of the sixth divide stage 101 is connected to provide an output 104 of the duration detector 100. The QN outputs 105 and 106 respectively of the eighth and ninth divide stages 101 are respectively connected to two inputs of a NOR gate 107, the third input of which constitutes a terminal 107a which is normally connected to the B+ supply voltage. To convert the receiver so that it is responsive to a single tone, the terminal 107a is connected to ground. The output of the NOR gate 107 constitutes a second output 108 of the duration detector 100. A second NOR gate 109 has one input coupled to the QN output 106 of the ninth divider stage 101 and has a second input coupled to the QN output 110 of the eleventh divider stage 101. In the absence of a code tone, the output 96 of the envelope detector 90 is normally low (FIG. 7B) so that the reset inputs to the divide stages 101 are normally high, whereby the divider chain defined thereby does not normally divide the Q3 clock signal. When the code tone is detected, the Q output 96 becomes high (actually 30 to 60 microseconds later) and the reset inputs to the divide stages 101 become low. The first six divide stages 101 divide the Q3 clock frequency by 64 ($2^6$), and, of course, multiply its period by 64. Assuming the Q3 clock signal has a frequency of 512 Hz., the half period thereof is about 0.977 ms., so that the half period of the signal at the Q output of the sixth divide stage 101 is 62.5 ms. Thus, if the duration of the detected code tone, as reflected by the control signal on the Q output 96, is 62.5 ms. or greater, then the output 104 will become high. Actually, there will appear on the output 104 an 8 Hz. (512 divided by 64) signal, but ensuing circuitry responds to the first transition from low to high and ignores the balance of the signal. It is to be understood that if the duration of the detected code tone was less than 62.5 ms., the reset inputs of the first six divide stages 101 would not remain low long enough for the Q output of the sixth divide stage 101 to become high.

As explained previously, terminal 107a is normally connected to the B+ supply voltage so that the output 108 is low irrespective of the inputs to the gate 107 from the QN outputs 105 and 106. However, if the single tone option is employed, the terminal 107a is connected to ground. The QN outputs 105 and 106 are normally high. The QN output 105 will become low if the code tone is 250 ms. in duration or greater (0.977 ms. + $2^8$) while the QN output 106 becomes low 500 ms. after the detected tone commences (0.977 ms. × $2^9$). If the control signal from the envelope detector 90 has a duration less than 500 ms., then both QN outputs 105 and 106 would not become low. A low on the QN outputs 105 and 106 will cause the output 108 to become high a time after commencement of the control signal equal to the sum of the time that it takes the QN outputs 105 and 106 to become low. In other words, the output 108 becomes high if the control signal has a duration of 750 ms. or greater (assuming that the terminal 107a is connected to ground).

The QN output 110 of the eleventh divider becomes low two seconds after inception of the detected code tone (0.977 ms. × $2^{11}$). The NOR gate 109 receives inputs from the QN output 106 and the QN output 110. The output 111, which is normally low becomes high a time after inception of the control signal equal to the sum of the time that it takes QN outputs 106 and 110 to become high, that is, 2.5 seconds.

When the receiver is programmed to respond to a sequence of two tones, the first tone has a duration of about 1.9 seconds in order to exceed the 1.75 second interval between battery spacer pulses plus the 62.5 ms. time needed for the output 104 to become high. A tone to cause the receiver to respond to group call is about 4.5 seconds in duration to exceed the 1.75 second interval between battery saver pulses plus the 2.5 seconds needed for the output 111 to become high. The control signal furnished by the envelope detector 90 will have a duration from between 150 ms. to 1.9 seconds in response to 1.9 second code tone, depending upon the start of the code tone relative to battery saver pulses. Similarly, the control signal will have a duration of from 2.75 seconds to 4.5 seconds in response to a 4.5 second group call code tone depending upon when the tone starts relative to a battery saver pulse. Thus, if the control signal has a duration of between 150 ms. and 1.9 seconds, reflecting a 1.9 second code tone, only the output 104 would become high. The output 108 would remain low because the terminal 107a is connected to the B+ supply voltage. The output 111 remains low because the maximum duration of the control signal is too short.

In the case of group call, where the tone duration is 4.5 seconds, the control signal has a duration between 2.75 seconds and 4.5 seconds, so that both outputs 104 and 111 become high. The output 104 becoming high is not important because no second tone will be received.

In the case of the single-tone option, the code tone will have a duration of greater than 2.5 seconds. If its duration is say 3 seconds, the control signal would have a duration of between 1.25 seconds and 3 seconds (ignoring detection time) which would cause the outputs 104 and 108 to become high. The output 104 becoming high is immaterial. Whether the output 111 is affected or not is also immaterial.

The outputs 108 and 111 are evaluated in logic circuitry which will be described later.

The output 104 is used to enable the second channel so that it can respond to a second code tone. The output 104 is connected to a timer 120 which has a latch 121 of substantially the same configuration as the latch 91. The latch 121 has a pair of NOR gates 122 and 123. The output of the gate 122 is connected to one of the inputs of the gate 123, and the output of the gate 123 is connected to one of the inputs of the gate 122. The remaining input of the gate 122 is the set input 124 of the latch 121, and the remaining input of the gate 123 is the reset input 125 of such latch. The output of the gate 122 is the QN output 126 and the output of the gate 123 is the Q output 127. The QN output 126 is normally high, the Q output 127 is normally low and both inputs 124 and 125 are normally low. When the set input 124 becomes high as the result of a detected code tone with a duration exceeding 62.5 ms., the latch 121 is set, causing the Q output 127 to become high. The latch 121 is characterized by the fact that subsequent changes in the signal applied to the set input 124 have no effect on its state. Thus, the fact that the signal on the output 104 is a pulsating signal at a frequency of 8 Hz. has no effect. The latch 121 will remain set until the reset input 125 becomes high.

The Q output 127 is coupled to one of the inputs of a NAND gate 129, the second input of which is coupled to the QN output 97 of the envelope detector 90. The input of the NAND gate 129 coupled to the Q output 127 is normally low, so that the output of such NAND gate is normally high. When the Q output 127 becomes high, in response to a first code tone having a duration exceeding 62.5 ms., the NAND gate 129 is not affected since the other input has just become low. On termination of the first code tone (actually 7 ms. thereafter), the QN output 97 becomes high, whereupon both inputs to the NAND gate 129 are high and the output thereof becomes low.

The output of the NAND gate 129 is coupled to a reset circuit 130 which includes five cascaded divide-by-two stages 131. The C input of the first divide stage 131 is connected to the Q3 clock signal, while its CN input is connected by way of an inverter 132 to such clock signal. C and CN inputs of each succeeding stage are connected respectively to the Q and QN outputs of the preceding stage. The reset inputs of all the divide stages 131 are connected together and to the output of the NAND gate 129. The Q output of the last divide stage 131 is connected to the reset input 125 of the latch 121. The output of the NAND gate 129 is normally high so that the divide stages 131 do not normally divide the Q3 clock signal. When the output of the NAND gate 129 becomes low upon termination of the first code tone, the reset inputs to the divide stages 131 become low. The divide stages 131 divide the Q3 clock frequency by 32 ($2^5$) and, of course, multiply its period by 32. Assuming the Q3 clock signal has a frequency of 512 Hz., the half period thereof is about 0.977 ms., so that the half period of the signal at the Q output of the last divide stage 131 is 31.25 ms. The Q output of the last divide stage 131 is coupled to the reset input 125 of the latch 121, whereby the latch 121 is reset causing the Q output 127 to revert to its normally low state in turn causing the output of the NAND gate 129 again to become low. When the latch 121 is reset, the output of the NAND gate 129 becomes high once again to turn off the divide stages 131. Thus, only a spike of very short duration pulse is developed by the last divide stage 131. Accordingly, there appears on the output of the NAND gate 129 an enabling signal commencing with the termination of the first code tone and lasting for 31.25 ms.

Figure 8:
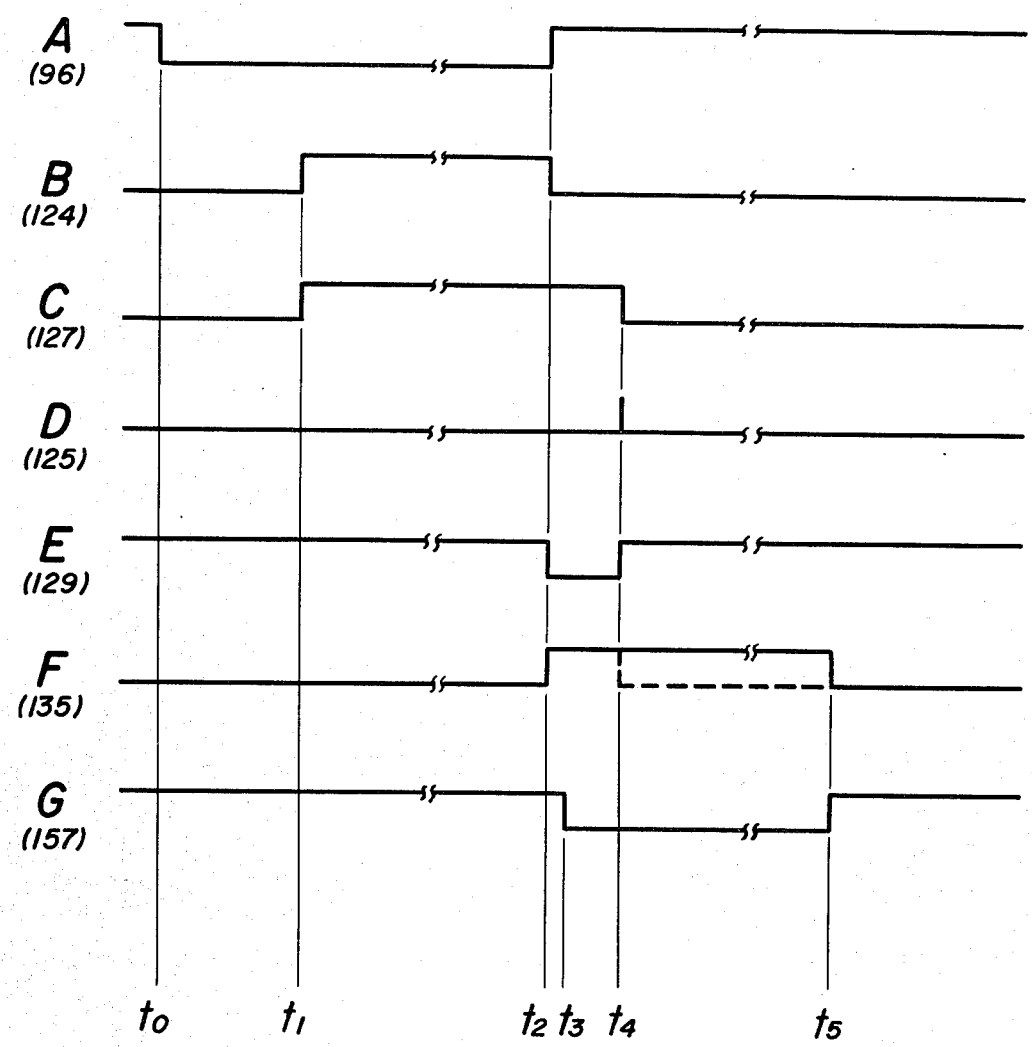
FIG. 8 depicts wave forms at various points in the timer and the feedback gate of FIG. 5.

Further details of the operation of the timer 120 can be had by reference to FIG. 8 which illustrates the wave forms at various points in the circuit of FIG. 5. FIG. 8A depicts the control signal on the output 96 of the envelope detector 90. This control signal commences at $t_0$ essentially with the start of the detected code tone, and ends at $t_2$ essentially with the termination of the code tone. FIG. 8B represents the wave form at the set input 124 of the latch 121. It is normally low and at $t_1$, 62.5 ms. after $t_0$, the set input 124 becomes high at least once to set the latch 121. FIG. 8C represents the wave form at the Q output 127. It is normally low and at time $t_1$ when the latch 121 switches, such output becomes high and remains high until 31.25 ms. following termination of the code tone. FIG. 8D represents the wave form at the Q output of the last divide stage 131, which is normally low. At $t_4$, 31.25 ms. after termination of the code tone at $t_2$, it becomes high; such Q output immediately becomes low again because the latch 121 is reset and the divide stages 131 stop counting. FIG. 8E depicts the enabling signal at the output of the NAND gate 129. Such output is normally high, and at $t_2$, the setting of the latch 121 causes it to become low and it remains low until the latch 121 is reset at $t_4$. The duration $t_2-t_4$ is 31.25 ms. The time $t_2-t_4$ constitutes a "window" during which the second channel is enabled to determine if the second code tone is present.

Referring back to FIG. 5, the enabling signal produced by the timer 120 is coupled to the feedback gate 135 which includes a NAND gate 136 having a first input 137 coupled to the NAND gate 129 and a second input 138 coupled to the output of the envelope detector 150 in the second channel, which second input is normally high. The input 137 becomes low on termination of the first code tone, as previously explained, causing the output of the NAND gate 136 to become high. If no second tone is received, the input 138 remains high and when the input 137 reverts to its high state 31.25 ms. later, the output of the NAND gate 136 becomes low once again. The NAND gate 136 is coupled through a pair of isolating inverters 139 to the frequency discriminator 45, which is rendered operative as previously explained. It is during the 31.25 ms. window that the frequency discriminator 45 is operative to process a second code tone. If a code tone of the proper frequency is received before or after the window, it is not processed.

Returning now to FIG. 8, wave form F thereof depicts the output of the feedback gate 135, which is applied to the frequency discriminator 45. That output is normally low. When the input 137 becomes low at time $t_2$ (FIG. 8E), the output of feedback gate 135 becomes high. If no second tone is received, such output will again revert to its normally low condition at $t_4$ when the input 137 becomes high once again, as represented by the dashed line in FIG. 8F. However, if the proper second tone appears, the output of the feedback gate 135 remains high until termination of the second tone at $t_5$.

Referring to FIG. 5, a proper second code tone will result in a sequence of tone pulses from the frequency discriminator 45 being applied to the delay circuit 140. The delay circuit 140 is substantially identical to the delay circuit 80 and is marked with corresponding reference numerals. There will be present on the output 144 a sequence of modified tone pulses corresponding to the train of tone pulses received from the frequency discriminator 45. The train of modified tone pulses will be similar to that shown in FIG. 6C, commencing 30–60 microseconds after detection of the second code tone.

The delay circuit 140 is coupled to an envelope detector 150 identical in construction and operation to the envelope detector 90 in the first channel. The envelope detector 150 is therefore labelled with corresponding reference numerals. Following the same analysis utilized with respect to the envelope detector 90, there appears on the outputs 156 and 157, oppositely poled control signals persisting for a duration substantially equal to the duration of the signal produced by the discriminator 45. It is "substantially equal" because the control signal commences 30–60 microseconds after the second code tone is detected and ends about 7 ms. after the second code tone ends. The control signal on the output 157 is coupled to the input 138 of the NAND gate 136.

Returning to FIG. 8, wave form G thereof depicts the control signal on the output 157 of the envelope detector 150. At time $t_3$, the second code tone commences and lasts for one of several possible durations, to $t_5$. There is shown a gap $t_2-t_3$ between the end of the first code tone and the start of the second code tone. Of course, the control signal starting at $t_3$ is delayed 30–60 microseconds from the detection of the second code tone, and the end of the control signal at $t_5$ is delayed 7 ms. following termination of the second code tone. Such control signal is applied to the input 138 of the feedback gate to cause the enabling signal, depicted in FIG. 8F, to continue beyond $t_4$ to $t_5$. Even though the second tone commencement is delayed from the termination of the first tone in the example shown, it still occurs within the window defined by the duration of $t_2-t_4$, as it must in order to be processed by the frequency discriminator 45.

Returning to FIG. 5, details of the duration detector 160 will be described. The duration detector 160 serves to determine the duration of the control signal from the envelope detector 150, which in turn means that the duration detector 160 is detecting the duration of the detected second code tone. The duration detector 160 includes eight divide-by-two, cascaded stages 161. The C input of the first divide stage 161 is connected to the Q3 clock signal, while its CN input is connected by way of an inverter 162 to the same clock signal. The C and CN inputs of each succeeding stage are connected respectively to the Q and QN outputs of the preceding stage. The reset inputs of all of the divide stages 161 are connected together and through an inverter 162a to the output 156 of the envelope detector 150. The Q outputs of the fifth, seventh and eighth divide stages 161 are connected respectively to provide outputs 163, 164 and 165. In the absence of a code tone, the output 156 of the envelope detector 150 is normally low so that the reset inputs to the divide stages 161 are normally high, whereby the divider chain defined thereby does not normally divide the Q3 clock signal. When the code tone is detected, the Q output 156 becomes high (actually 30 to 60 microseconds later) so that the reset inputs to the divide stages 161 become low. The first divide stages 161 divide the Q3 clock frequency by 32 ($2^5$), and, of course, multiply its period by 32. Assuming the Q3 clock signal has a frequency of 512 Hz., the half period thereof is about 0.977 ms., so that the half period of the signal at the Q output of the fifth divide stage 161 is 31.25 ms. (0.977×32). Thus, if the duration of the detected second code tone, as reflected by the control signal on the output 156, is 31.25 ms. or greater, then the output 163 will become high. Actually, there will appear on the output 163 a 16 Hz. (512 divided by 32) signal, but ensuing circuitry responds to the first transition from low to high and ignores the balance of the signal. It is to be understood that if the duration of the detected code tone is less than 31.25 ms., the reset inputs of the first five divide stages 161 would not remain low long enough for the Q output of the fifth divide stage 161 to become high.

The half period of the signal at the Q output of the seventh divide stage 161 is 125 ms. Thus, if the duration of the detected second code tone, as reflected by the control signal on the output 156, is 125 ms. or greater, then both the outputs 163 and 164 will become high. Actually, there will appear on the output 164 a 4 Hz. (512 divided by $2^7$) signal, but ensuing circuitry is responsive to the first transition from low to high and ignores the balance of this signal.

The half period of the signal at the Q output of the eighth divide stage 161 is 250 ms. Thus, if the duration of the detected second code tone, as reflected by the control signal on the output 156, is 250 ms. or greater, then all three outputs 163, 164 and 165 will become high. Again, a 2 Hz. signal actually appears on the output 165, but ensuing circuitry is responsive to the first transition.

Summarizing, the output 163 becomes high when the duration of the second tone is between 31.25 ms. and 125 ms. The outputs 163 and 164 become high when the duration of the second code tone is between 125 ms. and 250 ms. All three outputs will become high when the second code tone has a duration exceeding 250 ms.

The signals on the outputs 163, 164 and 165 are evaluated in logic circuitry which will be described by reference to FIG. 9.

The detected signals on the outputs 108 and 111 of the duration detector 100 and the detected signals on the output 163 of the duration detector 160 are coupled to a NOR gate 168, the output of which is coupled through an inverter 169 in a control circuit 170. The other two outputs 164 and 165 of the duration detector 160 are also coupled to such control circuit. Included in the control circuit 170 is the set of three latches 172, 179 and 186, each having the same basic construction as the latches heretofore described. Each has a pair of NOR gates, with the output of one gate being connected to one of the inputs of the other gate, and the output of the second-mentioned gate being connected to one of the inputs of the first-mentioned gate. The latch 172 has a set input 175, a reset input 176 and a Q output 177. The latch 179 has three set inputs 181, a reset input 182, a QN output 183 and a Q output 184. The latch 186 has a set input 189, a reset input 190 and a Q output 191. Each of the latches 172 and 186 has a second output which is not used and therefore is not labelled.

The output of the inverter 169 is connected to the set input 175 of the latch 172. The outputs 108, 111 and 165 are connected to the three set inputs 181 of the second latch 179. The output 164 is connected to the set input 189 of the latch 186. The reset inputs 176, 182 and 190 are connected together.

Considering first the latch 172, its set input 175 is normally low as is its Q output 177. When the set input 175 becomes high, the latch 172 switches states and the Q output 177 becomes high. The latch 172 is set when the output of the inverter 169 becomes high, which will occur when any of the outputs 108, 111 or 163 is high. One of those three will be high if any valid code is received. The outputs 108, 111 and 163 are normally low. When the receiver is programmed as a single tone receiver (terminal 107a is connected to the B+ supply voltage), the output 108 will become high when the duration of the detected first code tone exceeds 750 ms. When the receiver is programmed as a two-tone receiver (the terminal 107a is connected to ground), the output 163 becomes high when the second tone has a duration longer than 31 ms., meaning any proper two-tone call. If the duration of the detected first tone exceeds 2.5 seconds, signifying group call, the output 111 becomes high. Thus, any proper code to which the receiver is designed to respond will set the latch 172 and cause its output 177 to become high.

Considering now the latch 179, its set inputs 181 are normally low, the QN output 183 is normally high and the Q output 184 is normally low. If any of the set inputs 181 becomes high, the latch 179 switches states and the QN output 183 becomes low and the Q output 184 becomes high. One of the set inputs 181 becomes high if any of the outputs 108, 111 or 165 become high. As just explained, the output 108 will become high when the single tone option is employed and the duration of the detected first code tone exceeds 750 ms., while the output 111 becomes high if the detected first tone exceeds 2.5 seconds, signifying group call. The output 165 becomes high if the second tone of a two-tone code has a duration longer than 250 ms.

The third latch 186 has a set input 189 which is normally low and a Q output 191 that is normally low. The latch 186 is only set when the output 164 becomes high, that is, when the duration of the second tone in a two-tone code exceeds 125 ms.

The Q output 177 of the latch 172 is coupled to the reset circuit 200 which includes eight cascaded divide-by-two stages 201. The C input of the first divide stage 201 is connected to the Q4 clock signal, while the CN input is connected by way of an inverter 202 to such clock signal. The C and CN inputs of each succeeding stage are connected respectively to the Q and QN outputs of the preceding stage. The reset inputs of all the divide stages 201 are connected together and to the output of an inverter 203, the input of which is connected to the Q output 177 of the latch 172. A NOR gate 204 has one input connected to the QN output of the sixth divide stage 201 and a second input connected to the QN output of the eighth divide stage 201. The output of the gate 204 is in turn connected to one input of an OR gate 205, the output of which is connected to the reset inputs 176, 182 and 190 of the latches. A second input to the OR gate 205 is obtained from an AND gate 206 having one input derived from the QN output 183 of the latch 179 and a second input derived, through an inverter 207, from the QN output of the seventh divide stage 201. A third input to the OR gate 205 is obtained from the push-button switch 230.

Upon the occurrence of any proper code, the Q output 177 of the first latch 172 becomes high, causing the reset inputs to the divide stages 201 to become low. The first seven stages divide the clock frequency by 128 ($2^7$) and, of course, multiply the period by 128. Assuming the Q4 clock signal has a frequency of 16 Hz., the half period hereof being 31.25 ms., the half period of the signal at the QN output of the seven divide stages is four seconds (31.25 ms. × 128).

As was explained, the output 183 of the latch 179 is normally high, and the output of the inverter 207 will become high as soon as the QN output of the seventh divide stage 201 becomes low. In other words, the output of the gate 206 becomes high four seconds after the reset circuit 200 has had its reset input removed, which high output is coupled through the gate 205 to reset all three latches 172, 179 and 186.

The latches will not be reset in four seconds if the latch 179 is set as the result of any of the outputs 108, 111 and 165 becoming high, which occurs when: (a) the single tone option is employed and the duration of the tone exceeds 750 ms., or (b) when a code tone exceeding 2.5 seconds is received for group call, or (c) when the second tone of a two-tone sequence has a duration exceeding 250 ms. In any such event, the latch 179 is set and the QN output 183 becomes low to prevent the latches 172, 179 and 186 from becoming reset in four seconds. Instead, they will become reset in ten seconds in the following manner. The first six stages divide the Q4 clock frequency by 64 ($2^6$) and, of course, multiply the period by 64. Assuming the Q4 clock signal has a frequency of 16 Hz., the half period thereof is 31.25 ms. so that the half period of the signal at the QN output of the sixth divide stage 201 is 2 seconds (31.25 ms.×64). The half period of the signal at the QN output of the last divide stage 201 is 8 seconds (31.25 ms.×$2^8$). Actually, there will appear on the QN output of the sixth divide stage a 0.25 Hz. signal and there will appear on the QN output of the eighth divider stage a 0.0625 Hz. signal.

The inputs to the NOR gate 204 are normally high and become low respectively two seconds and eight seconds after the divide stages 201 have had their reset inputs removed. The output of the NOR gate 204 will become high a time after such reset equal to the sum of the times that it takes the QN outputs of the sixth and eighth divide stages 201 to become low. In other words, the output of the gate 204 becomes high ten seconds after the divide stages 201 are reset. The high output is applied to the reset inputs 176, 182 and 190 of the latches 172, 179 and 186 to reset same. Thus, the latch or latches that were set, are reset ten seconds later after the code has been detected.

If the receiver is programmed to receive a sequence of two tones, all three latches will be set for a period of 4 seconds if the second tone has a duration less than 250 ms. If the second tone duration is 250 ms. or more, or if the first tone is detected for a duration exceeding 2.5 seconds (group call) or if the receiver is programmed to be responsive to a single tone and the single tone is detected for a duration exceeding 750 ms., then the three latches will be set for a period of 10 seconds.

The latches 172, 179 and 186 can be manually reset at any time, by activating the push-button switch 230 (FIG. 1) causing the lowermost input of the OR gate 205 to become high.

One further function of the reset circuit 200 has nothing to do with respect to the reset function but rather to develop a pulsating signal to provide an intermittent alerting tone. For this purpose, the Q output of the second divide stage 201 is utilized at which there will be a pulsating signal at a frequency of 4 Hz. (16 divided by $2^2$).

The outputs of the three latches are coupled to the logic circuit 210 which analyzes their conditions to provide outputs corresponding thereto. The logic circuit 210 includes an AND gate 211 having one input coupled to the Q output 177 of latch 172 and a second input coupled to the QN output 183 of the latch 179. The output 177 is normally low and becomes high 31 ms. (actually 31.25 ms.) after detection of the second tone and stays high for 4 seconds if the duration of the second tone is less than 250 ms. or stays high for 10 seconds if this duration is greater than 250 ms. The output 183 stays high if the second tone of the duration is less than 250 ms. and if its duration exceeds 250 ms., then such output becomes low 250 ms. after the second tone starts and remains low for 10 seconds.

The output of the AND gate 211 will become high 31 ms. after the second tone starts and stay high for 4 seconds if the second tone is less than 250 ms. in duration. If the second tone is more than 250 ms. in duration, the output of the AND gate 211 will become low again after such 250 ms. interval is ended; in other words, it reverts to its low condition as soon as the output 183 becomes low.

The output of the AND gate 211 is one input of an OR gate 212, the other input of which is derived from another AND gate 213. One input of the AND gate 213 is coupled to the output 184 of the latch 179 and a second input is coupled to an OR gate 214. One input of the OR gate 214 is derived from the output 96 of the envelope detector 90 in the first channel, and the other input is derived from the output 156 of the envelope detector 150 in the second channel. The outputs 96 and 156 remain high essentially for the durations of the two code tones respectively. Thus, the output of the OR gate 214, which is normally low, becomes high essentially with the inception of the first tone and becomes low again after termination of the second tone. The other input of the AND gate 213 is derived from the output 184 of the latch 179 which remains low if the second tone has a duration less than 250 ms. If its duration exceeds 250 ms., that output becomes high 250 ms. after the second tone starts and remains high for a period of 10 seconds. Thus, the output of the AND gate 213 is normally low and remains low if the second tone has a duration less than 250 ms. On the other hand, if the duration of the second tone is greater than 250 ms., then its output will become high 250 ms. after the second tone starts and will remain high until the second tone ends.

The output of the OR gate 212 is normally low and becomes high when either of its inputs is high. When the second tone has a duration more than 31 ms. but less than 250 ms., the output of the gate 211 becomes high 31 ms. after the second tone starts so that the output of the gate 212 becomes high at that time also. Since the output of the gate 211 remains high for 4 seconds, the output of the gate 212 will be high for 4 seconds at the end of which time it will become low again. If the second tone has a duration of 250 ms. or greater, the output of the gate 211 becomes high 31 ms. after the second tone starts. Accordingly, the output of the gate 212 becomes high at that time also and remains high for 250 ms. because of the output furnished by the gate 211. Upon expiration of such 250 ms. period, the output of the gate 213 becomes high, so that the output of the gate 212 remains high until the output of the gate 213 becomes low again at the termination of the second tone.

The logic circuit 210 also includes a three-input OR gate 215 having a first input from the AND gate 213, a second input from the output 191 of the third latch 186, and a third input from the Q output of the second divide stage 201 in the reset circuit 200. As previously explained, such divide stage furnishes a continuous 4 Hz. signal; i.e., pulses 125 ms. in duration. When either of the other two inputs is high, the 4 Hz. signal is not reflected in the output of the gate 215. When both are low, the 4 Hz. signal appears on the output. When the second tone has a duration of 125 ms. or greater, the output 191 of the latch 186 becomes high 125 ms. after the second tone starts and stays high for 4 seconds, which is directly reflected in the output of the gate 215. In other words, if the second tone has a duration greater than 125 ms., the output of the OR gate 215 becomes high 125 ms. after the second tone starts, stays high for 4 seconds and thereupon reverts to its normally low state. If the second tone has a duration less than 125 ms., then the output 191 will remain low and the 4 Hz. signal will be coupled through the gate 215.

The output of the OR gate 215 is coupled to one input of an AND gate 216 which also has a second input from the OR gate 212 and a third input from the Q2 output of the clock 70. Whenever the inputs derived from the gates 212 and 215 are high, the 2,048 Hz. (2 KHz., for simplicity) signal on Q2 will appear on the output of the AND gate 216. When the second tone has a duration greater than 250 ms., the output of the gate 215 stays high for essentially 4 seconds, but the output of the gate 212 remains high only for the duration of the second tone. Accordingly, when the second tone has a duration greater than 250 ms., the 2 KHz. clock signal will appear on the output of the gate 216 for the duration of the second tone.

When the code tone has a duration of less than 250 ms. but 125 ms. or greater, the output of the OR gate 215 will still be high for 4 seconds, but the output of the gate 212 will also be high for 4 seconds so that the output of the gate 216 in the case of a code tone having a duration between 125 to 250 ms., will be a continuous 2 KHz. alerting tone.

When the duration of the second tone is greater than 31 ms. but less than 125 ms., then the gate 212 will still produce a 4 second signal but the gate 215 will produce a 4 Hz. pulsating signal, so that the gate 216 produces an interrupted alerting tone for 4 seconds in which each burst of alerting tone is 125 ms. in duration and there is 125 ms. between bursts.

The operating signal on the output of the OR gate 212 and the alerting tone on the output of the AND gate 216 are coupled to the gate circuit 220 which includes a NAND gate 221 having one input coupled to the output of the OR gate 212 and a second input coupled through an inverter 222 to the output of the AND gate 216. The gate circuit 220 includes a NOR gate 223 having one input coupled to the AND gate 216 through the inverter 222 and a second input coupled through an inverter 224 to the OR gate 212.

If the second tone has a duration 31 ms. or more, but less than 125 ms., the gate 221 produces intermittent bursts of tone. The operating signal from the gate 212 has essentially a 4 second duration when the duration of the second code tone is 31 ms. or greater but is less than 250 ms., so that the output of the NAND gate 221, which is normally high, consists of intermittent bursts of the alerting tone. When the duration of the second tone is between 125 ms. and 250 ms., the operating signal is still the same but because the alerting tone from the gate 216 is continuous, the gate 221 produces a continuous alerting tone for 4 seconds. Finally, when the code tone has a duration 250 ms. or greater, then the alerting tone from the gate 216 being continuous for the duration of the second tone and the operating signal from the gate 212 being present for the duration of the tone, the output of the NAND gate 221 persists for the duration of the second tone.

The output of the gate 223 is normally low, and it produces signals similar to those appearing at the output of the gate 221. These signals are applied respectively to a pair of serially connected FETs 225 and 226, the FET 225 having a PNP polarity and the FET 226 having a NPN polarity. The junction of the FETs 225 and 226 constitutes the output 227 of the gate circuit 220. The emitter of the FET 225 is connected to B+ and the emitter of the FET 226 is connected to B−.

The output 227 is normally floating because both FETs 225 and 226 are normally not conductive. The outputs of the gates 221 and 223 operate the FETs 225 and 226 in a push-pull fashion so that a continuous alerting tone for the duration of the second code tone is produced when the second code tone has a duration of 250 ms. or more. When the second code tone has a duration of 125 ms. or more, but less than 250 ms., there appears on the output 227 a continuous 2 KHz. alert tone for 4 seconds. Finally, when the duration of the second code tone is 31 ms. or more, but less than 125 ms., there appears on the output 227 bursts of the 2 KHz. alerting tone, each burst having a duration of 125 ms. and the bursts being separated by 125 ms.

The output 227 of the gate circuit 220 is coupled to the audio circuit 22 to couple the alerting tone thereto. Before and after the alerting tone (and even between bursts when the alerting tone is intermittent), the output 227 is floating so that the gate circuit 220 and preceding circuitry has no loading effect on the audio circuit 22. This is particularly important when the alerting tone is followed by intelligence. It would, of course, be highly undesirable for the audio circuit 22 to be loaded while the intelligence is being processed by the audio circuit.

Figure 9:
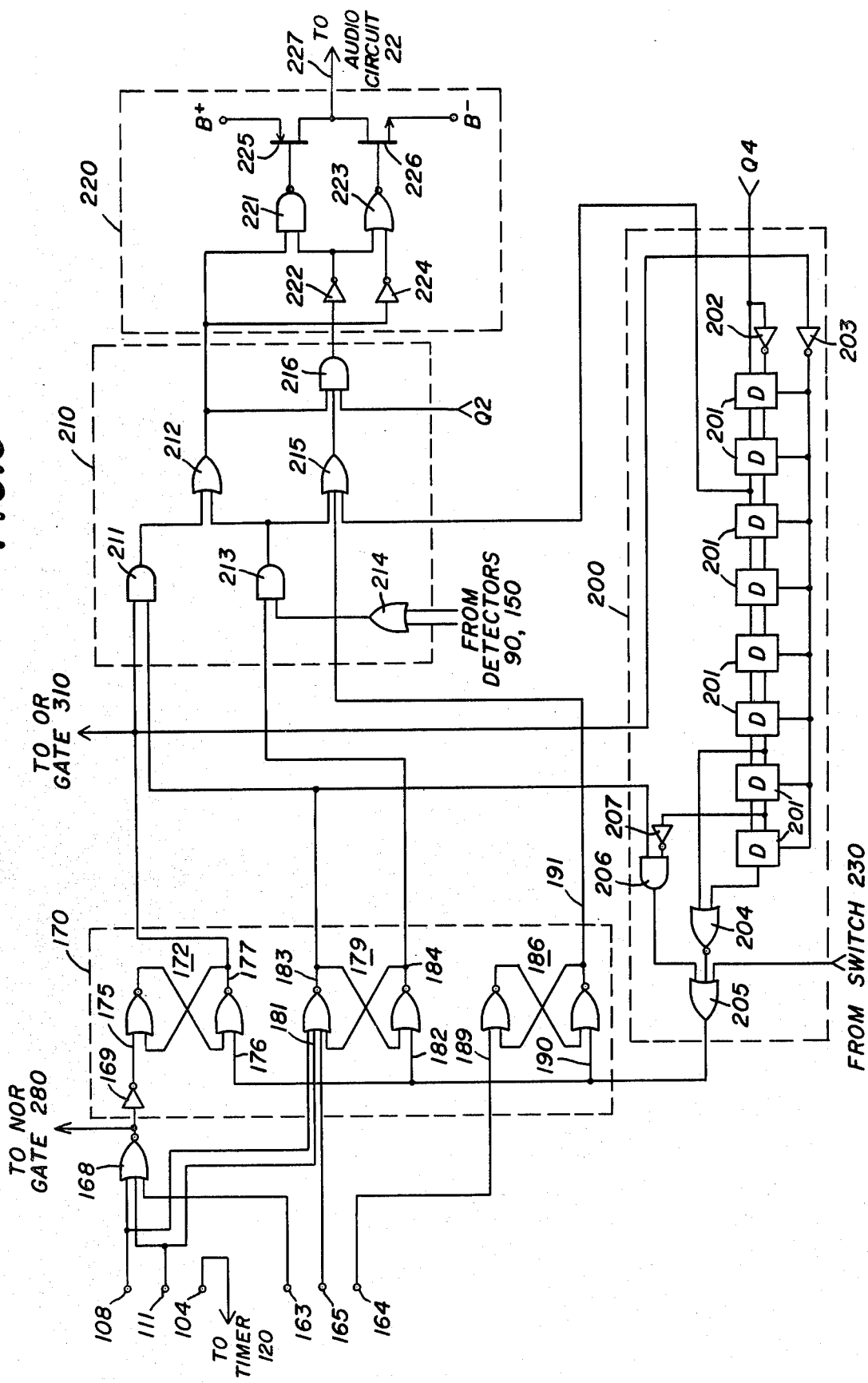
FIG. 9 is a block diagram of the latches, reset circuit, logic circuit and gate of FIG. 1.
Figure 10:
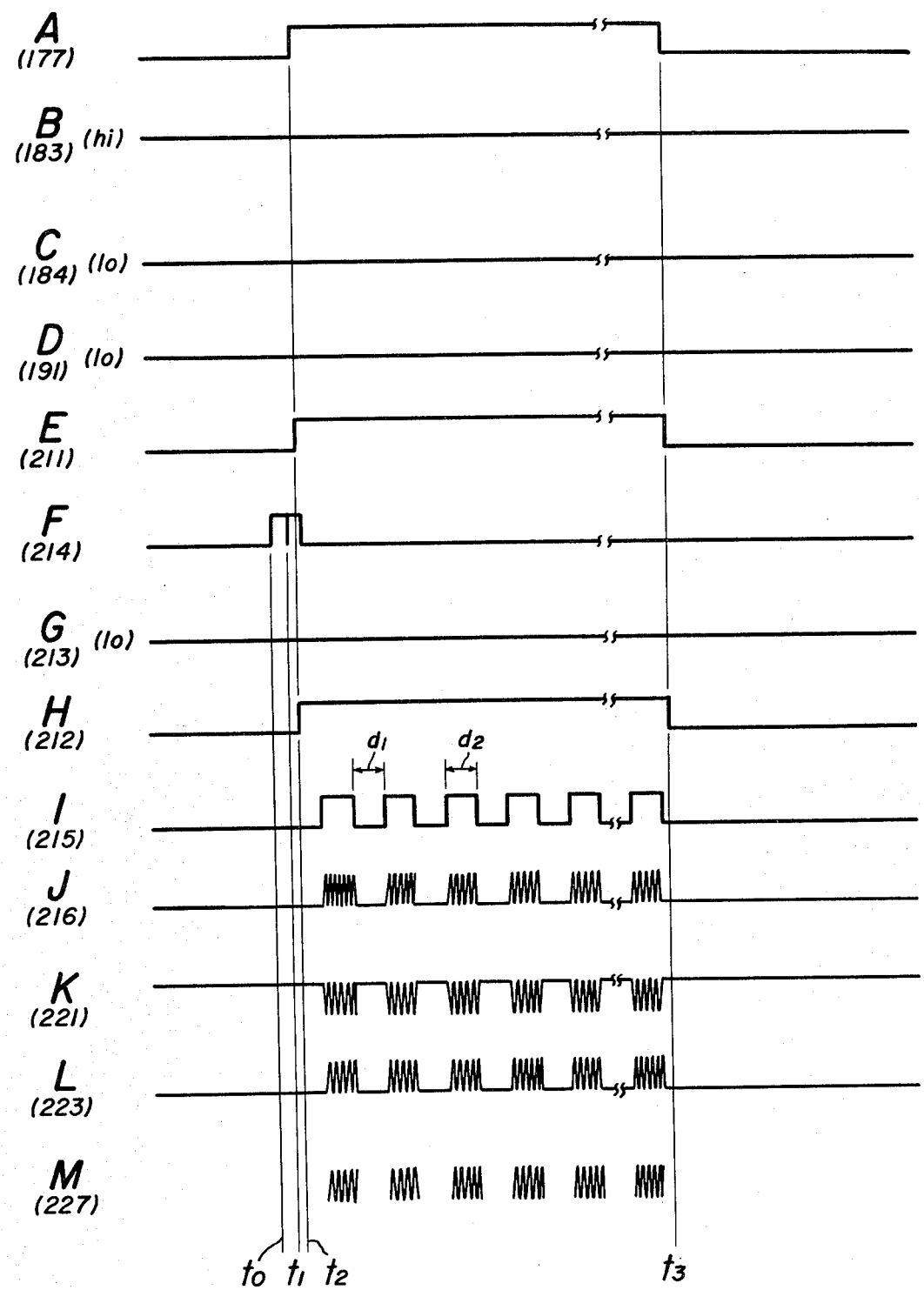
FIG. 10 depicts wave forms at various points in the diagram of FIG. 9 in response to a two-tone code in which the second tone has a short duration.

Turning now to FIGS. 10-13, further details of the operation of the circuit of FIG. 9 will be described. FIG. 10 illustrates the wave forms at the various points in the circuit depicted in FIG. 9 when the second code tone has a duration 31 ms. or greater but less than 125 ms. The points in the circuits are represented by the reference numerals in parentheses beneath each of the capital letters identifying the wave forms. Thus, FIG. 10A depicts the wave form on the output 177, wave form depicted in FIG. 10B depicts the wave form on the output 183, FIG. 10E depicts the wave form on the output of the AND gate 211 and so forth. Where the state does not change, an indication is shown in parentheses where the point is high or low. For example, when the second tone has a duration of between 31 ms. and 125 ms., the output 183 remains high and the output 184 remains low. Thus, in FIG. 10B, the word "hi" in parentheses is indicated, and in FIG. 10C, the word "lo" appears in parentheses. In FIG. 10, $t_0$ represents the time of commencement of the detected first code tone, $t_1$ represents the time of commencement of the detected second code tone. The interval $t_1$–$t_2$ is 31.25 ms. corresponding to the time before the duration detector 160 produces an output.

The reset circuit 200 resets the latches 172, 179 and 186 at time $t_3$. In the example discussed above, the interval $t_2$–$t_3$ is about 4 seconds. In FIG. 10I there is depicted a pulsating wave form having a 4 Hz. frequency, whereby the duration $d_1$ between pulses is 125 ms. and the duration $d_2$ of each pulse is 125 ms. As explained, the operating signal for the gate circuit 220 is shown in FIG. 10H, and the alerting tone applied to such gate means is shown in FIG. 10J. As shown in FIG. 10M, the alerting tone produced on the output 227 when the duration of the second code tone is at least 31 ms. in duration but less than 125 ms. is an intermittent alerting tone. It is important to note that during the absence of the bursts, the output 227 floats.

Figure 11:
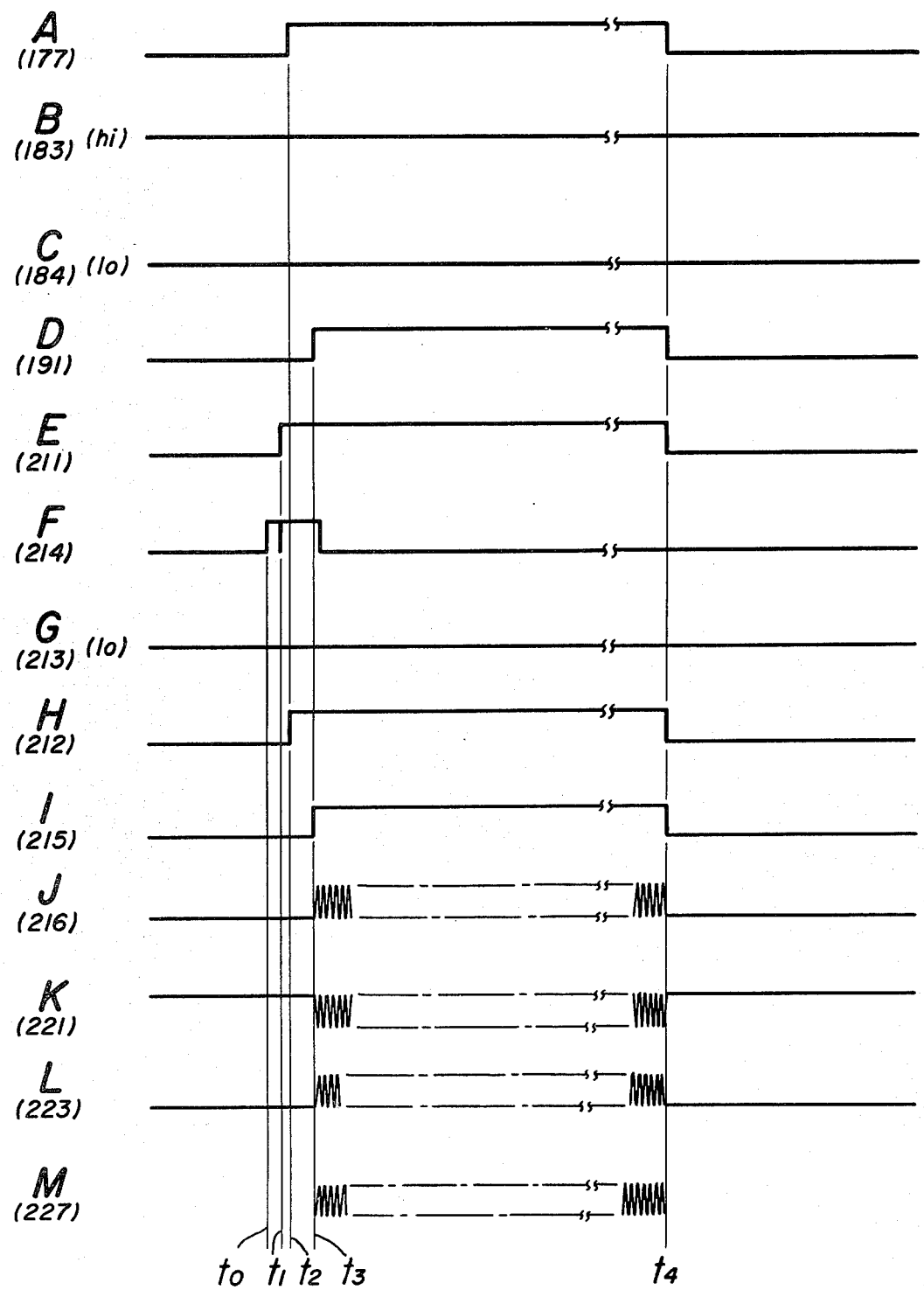
FIG. 11 depicts wave forms at various points in the diagram of FIG. 9 in response to a two-tone code in which the second tone has a medium duration.

FIG. 11 depicts the wave forms at the same points as the result of a second code tone having a duration of 125 ms. or greater but less than 250 ms. Again, at time $t_0$, detection of the first tone commences, and at time $t_1$, the second tone commences. The interval $t_1-t_2$ is 31 ms. corresponding to the time necessary to obtain the first output from the duration detector 160. Time $t_3$ occurs 125 ms. after time $t_1$ corresponding to the time needed to obtain a second output from the duration detector 160. The interval $t_3-t_4$ corresponds to the four-second period to reset the latches. The output 227 produces a continuous tone as shown in FIG. 11M. During the absence of that tone such output is floating.

Figure 12:
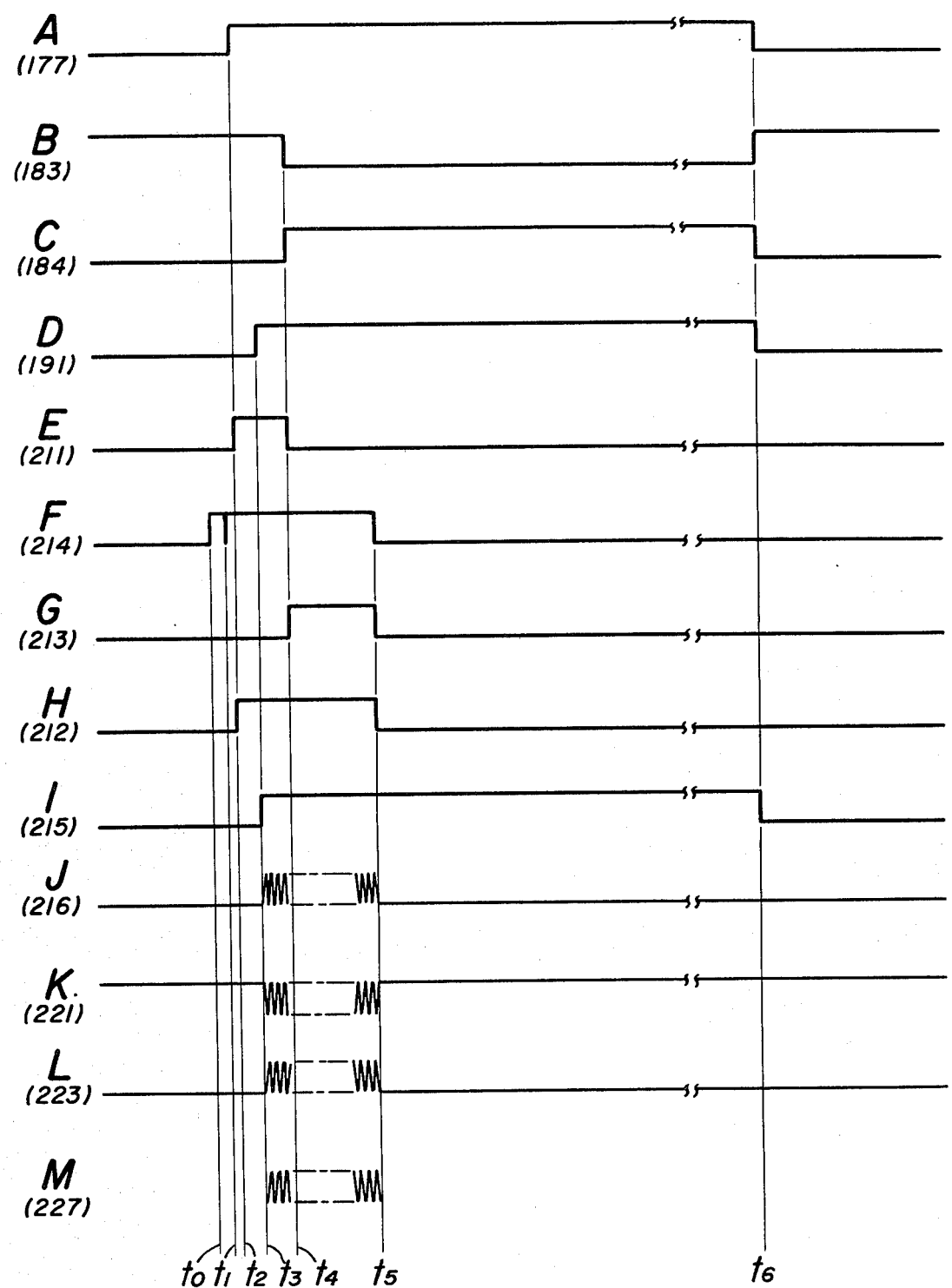
FIG. 12 depicts wave forms at various points in the diagram of FIG. 9 in response to a two-tone code in which the second tone has a long duration.

FIG. 12 depicts the wave forms at the various points in the circuits of FIG. 9 when the second code tone has a duration greater than 250 ms. Detection of the first code tone starts at time $t_0$ and detection of the second tone starts at time $t_1$. Time $t_2$ occurs 31 ms. after $t_1$, time $t_3$ occurs 125 ms. after $t_1$, and time $t_4$ occurs 250 ms. after time $t_1$, corresponding to the times needed respectively to obtain the three outputs from the duration detector 160. Time $t_5$ corresponds to the end of the second code tone and time $t_6$ corresponds to a period 10 seconds after the latches 172, 179 and 186 have been set. In this instance, the alerting tone will have a duration substantially equal to the duration of the second tone, extending from $t_3$ to $t_5$. It is not equal to the duration of the second tone, because there is a delay $t_1-t_3$ before the alerting tone shown in FIG. 12M is generated. In the absence of the alerting tone, the output 227 floats so as not to load the audio circuit 22.

Returning to FIG. 9, the details of the manner in which the receiver responds to group call will be described. Group call requires a much longer first tone, say 4.5 seconds, in order to bypass the second channel. Of that, 1.75 seconds insures that a battery saver pulse will have rendered the processor circuit 20 operative. From the instant the first tone is detected, it must have a duration of 2.5 seconds in order for the output 111 of the duration detector 100 to become high. The balance of the first tone, that is, 0.25 second controls the duration of the alerting tone. That alerting tone could be as long as two seconds if the first tone happened to start during a battery saver pulse.

Figure 13:
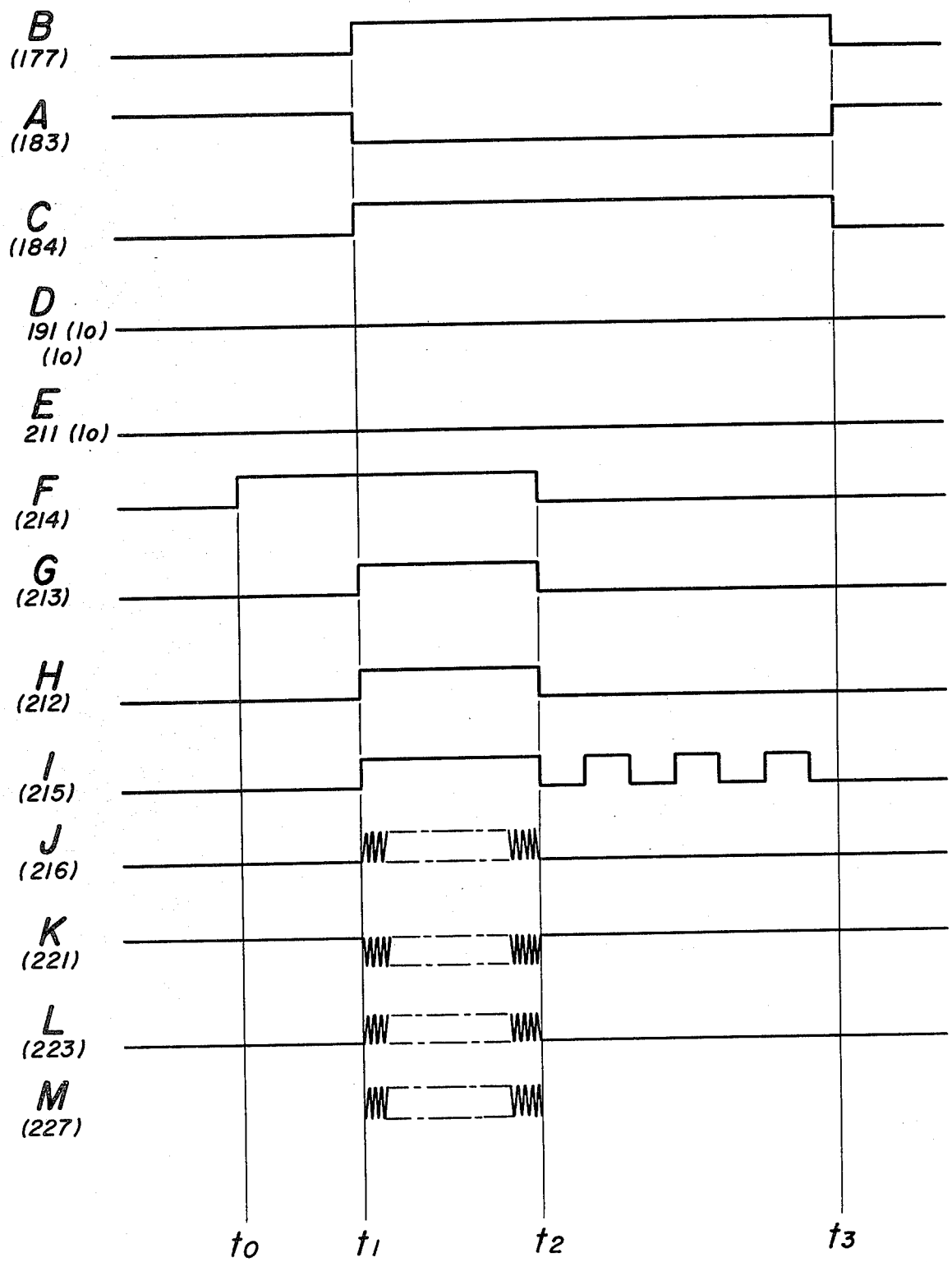
FIG. 13 depicts wave forms at various points in the diagram of FIG. 9 in the presence of a group call code.

FIG. 13 depicts wave forms at various points in the circuitry of FIG. 9 when a group call code is transmitted. In FIG. 13, the first tone is detected at $t_0$. The output 177 of the latch 172, which is normally low, becomes high at $t_1$, 2.5 seconds after the first tone is detected at $t_0$. The QN output 183 of the latch 179 is normally high and its Q output 184 is normally low. The latch 179 is connected to the output 108 so that the output 183 becomes low and the output 184 becomes high, at $t_1$. The output 191 of the third latch remains low.

The Q output 177 becoming high, removes the reset signal from the divide stages 201 of the reset circuit 200. Because the latch 179 has been set, the reset circuit 200 will not produce a reset signal in 4 seconds, but instead will produce a reset signal ten seconds after the latches 172 and 179 were set. Thus, at time $t_3$, 10 seconds after $t_1$, the latches 172 and 179 revert to their normal states. The logic circuit 210 processes the outputs from the latches 172, 179 and 186 in the manner previously described. The output of the gate 211 remains low as shown in FIG. 13E since the output 183 becomes low when the output 177 becomes high.

The gate 214 having one of its inputs from the detector 90, will become high as soon as the code tone is detected, at $t_0$, and will remain high until the end of the tone at $t_2$. The output of the OR gate 214 is coupled to one of the inputs of the AND gate 213, its other input being provided by the output 184 of the latch 179, which is high for the interval $t_1-t_3$. The output of the gate 213 will be high when both of its inputs are high, in other words, during the interval $t_1-t_2$. The operating signal produced by the OR gate 212, as shown in FIG. 13H, will be high whenever either of its inputs is high, that is, from $t_1$ to $t_2$.

Referring to the gate 215, the 4 Hz. signal applied to one of the inputs will not appear at its output as long as either of the other inputs is high. Thus, during the interval $t_1-t_2$, when the output of the gate 213 is high, the output of the gate 215 will be high and thereafter, the gate 215 will produce a 4 Hz. signal. With the outputs of both gates 212 and 215 being high for the interval $t_1-t_2$, the AND gate 216 is operative to apply to the gate circuit 220 the 2 KHz. clock signal from the Q2 output of the clock 70, as shown in FIG. 13J. The gates 221 and 223 produce alerting tones as shown in FIGS. 13K and L respectively. An alerting tone will appear on the output 227 for the interval $t_1-t_2$. Before and after the alerting tone, such output is floating so as not to load the audio circuit 22.

As described with reference to the two-tone operation, the duration ($t_1-t_2$) of the alerting tone varies. If the 4.5 second code tone commences with a battery saver pulse, then the alerting tone will have a duration of approximately 2 seconds (4.5-2.5). On the other hand, if the first code tone started just after a battery saver pulse, the alerting tone would be approximately 0.25 second in duration (4.5-2.5-1.75).

When the single-tone option is employed the circuitry in FIG. 9 will perform substantially in the manner just explained with respect to group call except that instead of the interval $t_0-t_1$ being 2.5 seconds, that interval would be 0.75 seconds, for example. If the first code tone has a duration of 2.75 seconds, for example, then the alerting tone will have a duration of between 0.25 second and 2 seconds, depending on the time the first code tone starts in respect to a battery saver pulse.

Turning now to FIG. 14, the details of the circuitry that control the time during which the receiver is squelched and unsquelched will be described. One of the important features of the present invention is the programmability of the receiver to be one of three different types:

I. a code-squelch type in which the receiver is normally squelched and is unsquelched for a predetermined time upon receipt of a proper code;

II. a code-squelch/monitor type, in which the receiver is manually placeable in one of two modes:
   A. a code-squelch mode (type I), and
   B. a monitor mode in which the receiver is unsquelched continuously.

III. a code-squelch/carrier-squelch type, in which the receiver is normally code squelched. Reception of a code or manual operation of a switch causes the receiver to be unsquelched by and for the duration of communications on the channel.

The manually operable push-button switch 230 in FIG. 14 is normally biased open. One terminal of the switch is connected to ground and the other terminal is connected to the Schmitt trigger 231 consisting of a pair of back-to-back inverters. The junction of the switch 230 and the Schmitt trigger 231 is connected to B+ via a resistor 232, having a filtering capacitor 232a thereacross. The output of the Schmitt trigger 231 is connected via a pair of serially connected inverters 233 to the reset circuit 200 (FIG. 9) and to the OR gate 310 (FIG. 1). Such output is normally low. When the switch 230 is closed, the input to the Schmitt trigger 231 is grounded and the output of the inverters 233 becomes high thereby enabling the audio circuit 22 through the OR gate 310 for as long as the switch 230 is held closed, so that the user can monitor the channel. The high output produced by the inverters 233 also simultaneously causes an output from the reset circuit 200 so that when the switch 230 is released, the receiver becomes automatically squelched. The inverters 233 prevent operations in the reset circuit 200 and the OR gate 310 from having an effect on the Schmitt trigger 231.

The inverters 233 are also coupled to a NOR gate 235 having a control terminal 236. The control terminal 236 is one of four terminals in the circuitry of FIG. 14 which can be selectively connected to enabling voltages to establish the receiver type. When the terminal 236 is connected to a B+ supply voltage, the receiver will be programmed to be Type I, normally squelched, and unsquelched by the proper code. None of the circuitry to the "right" of the inverters 233 will be affected by operation of the switch 230. To program the receiver to be Type II or Type III, the control terminal 236 is grounded, in which case the normally high output of the gate 235 becomes low whenever and for the duration that the switch 230 is operated. The output of the NOR gate 235 is normally high so that the timer circuit 240 is not operative. When the switch 230 is closed, and for the time it is closed, the output of the NOR gate 235 becomes low.

The output of the NOR gate 235 is coupled to a timer circuit 240 which includes four cascaded divide-by-two stages 241. The C input of the first divide stage 241 is connected to the Q4 clock signal, while the CN input is connected by way of an inverter 242 to such clock signal. The C and CN inputs of each succeeding stage are connected respectively to the Q and QN outputs of the preceding stage. The reset inputs of all the divide stages 241 are connected together and to the output of the NOR gate 235.

The divide stages 241 divide the clock frequency by 16 ($2^4$) and, of course, multiply the period by 16. Assuming the clock signal has a frequency of 16 Hz., the half period thereof being 31.25 ms., the normally low output of the last divide stage 241 becomes high 500 ms. (31.25 ms. × 16) after the switch 230 was actuated. Thus, if the switch 230 is "tapped", by closing it for less than 0.5 second, the output of the timer circuit 240 remains low while if the switch 230 is closed for 0.5 seconds or longer, the output of the timer circuit 240 will become high. Actually, there will appear on the output of the timer cirucit 240 a 1 Hz. (16 divided by 16) signal, but ensuring circuitry responds to the first transition from low to high and ignores the balance of the signal.

The gate 235 and the timer circuit 240 are connected to an electronic switch circuit 250. The electronic switch circuit 250 includes an inverter 251 which isolates signals produced in the balance of such circuit from the timer circuit 240 and the NOR gate 235. The inverter 251 is coupled to the clock input of a D type flip-flop circuit 252, the CN input thereof being coupled via an inverter 253 to the inverter 251. The reset input R of the circuit 252 is coupled to the NOR gate 235. In a D type flip-flop circuit, when the R input is low, the Q output will follow the D input on the occurrence of a positive transition on the C input. For example, if the D input is high, the Q output will become high on the next positive transition of a clock pulse.

The entirety of the electronic circuit 250 is part of the integrated circuit which makes up most of the circuitry described in the present application. A discrete component which would perform similarly is a "Dual Type D Flip-Flop" No. 4013. Motorola makes such a device under its number MC14013B. The logic diagram for such device is shown in FIG. 15. For simplicity, all the interconnections between the C and CN inputs have not been shown. The device has a QN output but that is not used in the circuit of FIG. 14.

The Q output of the circuit 252 is connected to a latch 255 having substantially the same configuration as the latches previously described. The latch 255 has a pair or NOR gate 256 and 257. The output of the gate 256 is connected to one of the inputs of the gate 257, and the output of the gate 257 is connected to one of the inputs of the gate 256. The remaining input of the gate 256 is the set input 259 of the latch 255, and the other three inputs of the gate 257 are the reset inputs 258 of such latch. The output of the gate 257 is the Q output 260 of the latch 255.

The output of the latch 255 is coupled to the C input of a set/reset input flip-flop circuit 261 and is also coupled to its CN input by way of an inverter 262. The circuit 261 has a Q output 263, a QN output 264 and a reset input defining a control terminal 265. The circuit 261 is part of the overall integrated circuit, but the same 4013 device may be used for this element, in which case the D input (not shown) is connected directly to the QN output. As a result, operation of the circuit 261 is simpler. When the R input (terminal 265) is low, the Q and QN outputs switch states each time there is positive transition on the C input. The QN outputs 263 and 264 will, however, be unaffected by negative transitions at the C input. When the receiver is programmed to be Type I, the control terminal 265 is connected to the B+ supply voltage so that it does not operate. When the receiver is programmed as Type II or Type III, the control terminal 265 is connected to an enabling voltage in the form of ground reference potential.

The Q output 263 is coupled to one input of a NAND gate 270, the other input of which constitutes a control terminal 271. The output of the NAND gate 270 is connected via an inverter 272 to the OR gate 310. The Q output 263 is also connected to one input of a NAND gate 275, the other input of which is derived from the processor circuit 20. Whenever the receiver picks up a carrier wave to which it is responsive, the processor circuit 20 produces what is commonly referred to as "a squelch signal". Actually, the term is somewhat of a misnomer in that the signal is used to unsquelch the receiver. The squelch signal is in the form of a high or B+ supply voltage applied to the second input of the NAND gate 275, such input being normally low in the absence of the carrier wave. The output of the NAND gate 275 is coupled via an inverter 276 to the OR gate 310. The QN output 264 of the circuit 261 is connected to the battery saver circuit 290. The Q output 263 is also fed back to the D input of the circuit 252 and to one of the inputs of a NOR gate 280, another input being coupled to the NOR gate 168 (FIG. 1) and the output of which is coupled to one of the reset inputs 258 of the latch 255. A third input of the gate 280 constitutes a control terminal 281. The control terminal 281 is connected to the B+ supply voltage when the receiver is programmed to the Types I or II. When the receiver is to be programmed as a Type III, the control terminal 281 is connected to an enabling voltage in the form of ground reference potential.

In operation, when the receiver is programmed to be a code-squelch type (Type I), the terminals 236, 265, 271 and 281 are not connected to enabling voltages, whereby the gates 235, 270 and 280 and the electronic switch circuit 250 are inoperative. Then, closure of the switch 230 turns on the audio circuit 22 for as long as the switch is closed. Also, operation of the switch 230 resets the latches 172, 179 and 186 via the OR gate 205 so that the receiver becomes unsquelched, if it had been turned on, as soon as the switch 230 is released.

If it is desired to program the receiver to be a code-squelch/monitor (Type II), the terminals 236 and 265 are connected to the ground enabling voltage, and the control terminal 271 is connected to the B+ enabling voltage. When so programmed, the receiver is initially in its code-squelch mode. In other words, the receiver is normally squelched, and is unsquelched when the proper code is received. The receiver may be unsquelched for a relatively long time when the code is followed by a message, or for a relatively short time in a tone-only operation. Following completion of the time-out period, the receiver is automatically squelched again and is unsquelched only when a subsequent proper code is received. The receiver can be manually placed in its monitor mode by closing the switch 230 for at least 0.5 second. Closure of the switch 230 causes the normally high output of the gate 235 to become low. If the switch 230 is closed for 0.5 second or longer, the normally low output of the timer circuit 240 becomes high which is applied to one of the reset inputs of the latch 255, thereby resetting same and causing the normally high output 260 to become low. Since the control terminal 281 of the gate 280 is connected to B+, the output thereof is maintained low so that such gate has no effect on the electronic switch circuit 250. Since the control terminal 265 is connected to ground, the high produced on the C input of the circuit 261 as a result of releasing the switch 230 after it has been closed for more than 0.5 second, causes the normally low Q output 263 to become high and the normally high QN output 264 to become low. The low output 264 changes the rate of the battery saver pulses. The fact that the rate of the battery saver pulses changes when the receiver is programmed as a Type II is not important because the battery saver circuit 290 produces a continuous supply voltage when the receiver is in the monitor mode. The output of the gate 270 becomes low since the control terminal 271 is connected high and the Q output 263 has become high with release of the switch 230. The output of the inverter 272 becomes high which is coupled to the OR gate 310 to render operative the audio circuit 22. The audio circuit is thereby latched on so that the receiver is in its monitor mode and all communications on the channel can be heard. The receiver is unsquelched so that any noise between communications is also heard. When the switch 230 is released, the output of the gate 235 becomes high again which is applied to the set input 259 of the latch 255 thereby setting same and causing the output 260 thereof to revert to its normally high state. The set/reset flip-flop circuit 261, however, is only responsive to positive transitions, so that the negative transition on the C input 0.5 second after closing the switch 230 has no effect, and the Q output 263 remains low and the QN output 264 remains high until the switch 230 is released.

The fact that the NAND gate 275 also becomes operative when the Q output 263 becomes high is not significant since the Type II receiver need not have the connection between the processor circuit 20 and the gate 275. Even if it did have such connection, the carrier would have no effect since the signal produced by the NAND gate 270 causes the audio circuit to be constantly on.

To take the receiver out of its monitor mode, and return it to its code-squelch mode, the switch 230 is closed, causing the output of the gate 235 to become low which is inverted and applied to the set input 259 of the latch 255 and the C input of the D flip-flop circuit 252. Since the D input of the circuit 252 was high, its Q output will become high, thereby resetting the latch 255. The Q output 260 of the latch 255 will become low. When the switch 230 is released, causing the set input 259 to become high, the Q output will become high again. The set/reset flip-flop circuit 261 will change states on this positive transition causing the QN output 264 to become high again and the Q output 263 to become low. The latter disables the gate 270 and causes the audio circuit 22 to become disabled, thereby squelching the receiver.

It will be noted that the time of closure of the switch 230 has no effect. As long as the receiver is placed in its monitor mode by closing the switch 230 for 0.5 second or more, a subsequent closure of such switch whether for more or less than 0.5 second, will reset the receiver and retrun it to its code-squelch mode.

In order to program the receiver to be a code-squelch/carrier-squelch Type (III), the control terminals 236, 265 and 281 are coupled to an enabling voltage, while the terminal 271 is coupled to a disablaing voltage; i.e., all four terminals are grounded.

When so programmed, the receiver is normally squelched and is unsquelched when the proper code is received. The receiver may be unsquelched for a relatively long period of time when the code is followed by a message, or for a shorter time in a tone-only operation. After completion of the alerting tone and the voice message, the receiver is automatically placed in its carrier-squelch mode. In other words, the receiver becomes squelched, but will be unsquelched by any communication on the channel. The receiver is placed in this mode in the following manner.

The output of a NOR gate 168 (FIG. 9) is low when any proper code is received. When the receiver is designed to respond to a two-tone sequence, as soon as the second tone has been present for the requisite time, the output of the NOR gate 168 becomes low. When the first tone is present for an exceptionally long period of time signifying group call, or when the receiver is programmed to respond to a single tone and the detected tone is present for at least 1.75 second, the output of the NOR gate 168 becomes low. Another input to the gate 280 is derived from the Q output 263 of the circuit 261 and is normally low. The terminal 281 is grounded. Accordingly, as soon as the output of the NOR gate 168 becomes low in response to a proper code, the output of the gate 280 becomes high. This is applied to one of the reset inputs 258, thereby resetting the latch 255 and causing its output 260 to become low. When the code terminates, the output from the NOR gate 168 becomes again which causes the output from the NOR gate 280 to become low. This causes the Q output 260 from the latch 255 to revert to its high state. Such positive transition causes the set/reset flip-flop circuit 261 to flip and the Q output 263 to become high and the QN output 264 to become low. Such low output is coupled to the battery saver circuit 290 to cause the rate of battery saver pulses to increase. The output 263 being high enables the NAND gate 275. During the presence of the code, the carrier wave is present so that the other input to the NAND gate 275, derived from the processor circuit 20 is high, whereby the output of the gate 275 becomes low and the output of the inverter 276 is high to render the audio circuit 22 operative (by way of the OR gate 310). Because the other input to the NAND gate 270 from the terminal 271 is low, the high on the output 263 has no effect thereon.

The high appearing on the Q output 263 is coupled back to the D input of the D type flip-flop circuit 252. The next positive transition on the C input of the circuit 252 will cause such high to be reflected on the Q output of the circuit 252. The high on the Q output 263 is also coupled to one of the inputs of the NOR gate 280 which causes its output to remain in its low condition. Detection and loss of another code will not affect the output of the NOR gate 280. Thus, the receiver can be placed in the carrier squelch mode by a proper code, but cannot be taken out of this mode by a subsequent proper code.

Thus, receipt of the proper code has placed the reciver in a carrier-squelch mode so that any transmission on the channel will be heard by the receiver whether or not such transmission includes the proper code or even includes any code. Each time such transmission occurs, the output of the gate 275 becomes high and the OR gate 310 is rendered operative so that the audio circuit 22 is rendered operative for the entirety of the transmission. When the transmission ends, the carrier wave ends and the output of the gate 275 becomes low again, whereby the audio circuit 22 is rendered inoperative and the receiver is squelched. A subsequent transmission on the channel wave will render the audio circuit 22 operative again so that communications can be heard. The receiver will remain in this carrier-squelch mode until the switch 230 is momentarily closed.

When the switch 230 is closed, the output of the gate 235 becomes low, which is applied to the set input 259 of the latch 255. Such output is also inverted by the inverter 251 and applied to the C input of the D flip-flop circuit 252. The Q output of the circuit 252 becomes high on this positive transition because the D input thereof is high. The set input 259 is low and one of the reset inputs 258 is high, causing the Q output 260 of the latch 255 to become low. This negative transition high to low will not afface the set/reset flip-flop circuit 261. But, when the switch 230 is released, the set and reset inputs to the latch 255 change polarities, so that the Q output 260 reverts back to its high state. Such negative transition on the clock input of the circuit 261 causes it to switch causing its Q output 263 to become low and its QN output to become high. The battery saver circuit 290 will revert to producing pulses at the quiescent rate. The Q output 263 being low disables the NAND gate 275 so that subsequent transmissions on the carrier wave are not reflected in the output thereof.

The receiver is reset to the code-squelch mode irrespective of the length of time the switch 230 is actuated. In other words, whether or not the output of the timer circuit 240 remains low or becomes high after 0.5 second of actuation, the above-described sequence of events take place.

The receiver can manually be placed in its carrier-squelch mode by operating the switch instead of receiving a proper code. When the switch 230 is depressed, the output of the gate 235 becomes low which starts the timer circuit 240. If the switch 230 is closed for 0.5 second or more, then the output of the timer circuit 240 becomes high to set the latch 255 and cause its output 260 to become low. When the switch is released, such output 260 becomes high again. The positive transition causes the circuit 261 to flip, whereupon the Q output 263 becomes high and the QN output 264 becomes low. The receiver is now in the carrier-squelch mode so that all subsequent communications on the channel will be heard by the receiver, and between communications the receiver will be squelched. In other words, the receiver performs exactly like it performs following reception of a proper code.

To reset the receiver back to its code-suqelch mode so thereafter it will only respond to the proper code, the push-button switch 230 is actuated. The effect is the same as that which takes place when the receiver is reset to its code-squelch mode after having received the proper code. The Q output 263 becomes low and the QN output 264 becomes high. The battery saver circuit 290 will revert to producing pulses at its quiescent rate while the audio circuit 22 will be disabled until a proper code is received. In the particular circuitry shown in FIG. 14, resetting of the receiver to its code-squelch mode is accomplished by operating the switch 230 for any period of time. As a result, if the switch were closed for longer than 0.5 second, the receiver could be set into either mode, depending on what mode it had been in. Suitable modification can be made to enable reset only when the push-button switch 230 is tapped, that is, closed less than 0.5 second and to always set in the carrier mode when held for more than 0.5 second. With such modification, the user can readily determine whether he is resetting the receiver into its code-squelch mode or is setting it into its monitor mode (Type II) or carrier-squelch mode (Type III).

Referring now to FIG. 16, details of the battery saver circuit 290 will be described. The circuit 290 includes five cascaded divided-by-two stages 291. Then C input of the first divide stage 291 is connected to the Q4 clock signal, while the CN input is connected by way of an inverter 292 to such clock signal. The C and CN inputs of each succeeding stage are connected respectively to the Q and QN outputs of the preceding stage. The reset inputs of all the divide stages 291 are connected together.

When the reset inputs are low, the first three divide stages 291 divide the Q4 clock frequency by 8 ($2^3$), and, of course, multiply its period by 8. Assuming the Q4 clock signal has a frequency of 16 Hz., the half period thereof being 31.25 ms., the normally high QN output of the third divide stage 291 becomes low 0.25 second (31.25 ms.×8) after the reset inputs had become low. Similarly, the QN output of the fourth divide stage 291 which is normally high, becomes low 0.5 second after the reset inputs have become low. Finally, the QN output of the fifth divide stage 291 becomes low one second after the reset inputs become low.

The QN outputs of the third, fourth and fifth divide stages 291 are coupled to the three inputs of a NOR gate 293, the output of which is coupled to one input of an OR gate 295. The output of the OR gate 295 is coupled to a latch 296 having substantially the same configuration as the latches previously described. Specifically, the latch 296 has a pair of NOR gates 297 and 298. The output of the NOR gate 297 is connected to one of the inputs of the gate 298, and the output of the gate 298 is connected to one of the inputs of the gate 297. The remaining input of the gate 297 is the reset input 299 of the latch 296, and the remaining input of the gate 298 constitutes the set input 300 of the latch. The latch 296 has a Q output 301 and a QN output 302. Actually a 2 Hz. signal would appear on the QN output of the third divide stage, a 1 Hz. signal would appear on the QN output of the fourth stage, and a 0.5 Hz. signal would appear on the output of the fifth divide stage if the divide stages were never reset.

Using standard logic analysis, the output of the NOR gate 293 becomes high at a time after the stages 291 have been reset, equal to the sum of the times that it takes QN outputs of the third, fourth and fifth divide stages 291 to become low. In other words, the outputs of the gate 293 become high 1.75 seconds after reset inputs of the divide stages 291 become low.

The output of the fourth divide stage is applied as one input to a NOR gate 294, the other input of which is derived from the electronic switch circuit 250. When the receiver is in a carrier squelch mode, the output of the electronic switch circuit 250 is low and the output of the NOR gate 294 becomes high 0.5 second after the stages 291 have been reset. For the purpose of the present explanation, it will be assumed that the receiver is not in its carrier squelch mode, so that the output of the NOR gate 294 remains low.

Upon the occurrence of the Q4 clock pulse, the set input 300 becomes high causing the latch 296 to become set, i.e., switch states, causing the Q output 301 to become high, in turn causing the reset inputs to the stages 291 to become low. The time therefore that the latch is reset is ½ the period of the Q4 clock signal, that is, 31.25 ms.

The output of the NOR gate 293 becomes low immediately after becoming high. Setting the latch 296 causes the reset inputs of the divide stages 291 to become high, so that all the QN outputs thereof return to their normally high conditions and the output of the NOR gate 293 becomes low. Thus, the output of the NOR gate 293 is simply a positive spike every 1.75 seconds.

A pulsed supply voltage will appear on the QN output 302, in which the duration of each pulse is 31.25 ms. and the interval between pulses is 1.75 seconds. The QN output 302 is coupled to one input of a four-input NOR gate 304, the other inputs of which are derived from the envelope detector 90, the feedback gate 135 and the OR gate 310. The output of the NOR gate 304 is coupled through a pair of serially connected inverters 305, for isolation purposes, to a PNP transistor 306, the emitter of which is coupled to the B+ supply voltage. The collector has a filtering capacitor 307 connected to ground.

The pulsating voltage on the QN output 302 causes an inverted pulsating signal to appear on the output of the NOR gate 304. The pulses are negative, have a duration of 31.25 ms., and cause conduction of the transistor 306. Thus, there will appear on the collector of the transistor 306 a pulsating signal 31.25 ms. in duration and separated by 1.75 second intervals. This signal constitutes the battery saver pulsed power BS-B+ for the various elements of the receiver including the processor circuit 20, the audio circuit 22, (FIG. 1) and others.

The other three inputs to the NOR gate 304 cause the pulsating B+ supply voltage to become continuous under certain circumstances. First, the output of the envelope detector 90 is normally low, but as soon as the first code tone is detected, such output becomes high and stays high for the duration of that tone, causing the output of the NOR gate 304 to become low for the same duration and causing the BS-B+ supply voltage to become continuous despite the pulsating voltage on the output 302. Such continuous supply voltage maintains the processor circuit continuously operative to process subsequent code tones. The output of the envelope detector 90 becomes high very quickly upon detection of the first tone, within several ms., so that the battery saver pulses can be short in duration. In this particular example each pulse has a duration of 31.25 ms., but aside from tolerances, they need be just slightly longer than that few millisecond time needed to detect the first tone.

On termination of the first tone, the output of the feedback gate 135 becomes high and stays high for a predetermined duration enabling analysis of the second tone by the second channel in the decoder circuit. This window is 31.25 ms. in duration. Thus, the supply voltage is maintained continuous for this additional 31.25 ms. by virtue of the output of the feedback gate 135 being coupled to the NOR gate 304. If the receiver does not receive the proper second tone, then the output from the feedback gate 135 will again become low and the pulsating signal on the output 302 of the latch 296 will again take over. The various circuits in the receiver will then again be powered by pulsating voltage.

On the other hand, if the second tone is received, the output of the feedback gate 135 is maintained high so that the supply voltage is maintained to the processor circuit 20, the audio circuit 22 and other circuits in the receiver, for the duration of the second tone.

The NOR gate 304 also receives an input from the OR gate 310, the output of which is high whenever the audio circuit 22 is enabled. Thus, even though the feedback gate 135 output becomes low again upon termination of the second tone, the fact that the audio circuit 22 has been turned on, will maintain the supply voltage continuous. When the audio circuit 22 is disabled, then the battery saver circuit 290 will revert to producing the pulsating supply voltage for the receiver.

An important aspect of the present invention is the ability of the battery saver circuit 290 to produce the pulsating voltage at a more rapid rate when the receiver is in its carrier-squelch mode. The QN output 264 of the electronic switch circuit 250 (FIG. 14) is normally high. When the receiver has been programmed as a Type III, and has been placed in its carrier-squelch mode either by operating the push-button switch 230 or by receipt of a proper code, such QN output becomes low. This QN output connects to one of the inputs of the NOR gate 294. With this input low, the battery saver circuit 290 will supply a pulsating signal in which the duration of the pulses is still 31.25 ms., but the interval between pulses is reduced to 0.5 second, that being the time for the QN output of the fourth divide-by-two stage 291 to become low. This signal is coupled through the NOR gate 304 and operates the transistor 306 so that the BS-B+ voltage applied to the processor circuit 20, the audio circuit 22, etc. is at a much more rapid rate.

When a communication is subsequently sent on the channel, the carrier wave will immediately be detected by the squelch circuit in the processor circuit 20 (FIG. 1). This high output will be reflected as a high on the output of the AND gate 275, because the second input to this gate which is derived from the Q output 263 of the electronic switch circuit 250, is also high. This output signal is coupled to the OR gate 310 (FIG. 10) which in turn is coupled to the audio circuit 22 to render the audio circuit 22 operative to amplify the ensuing voice message. The longest delay there could be between actuation of the push-to-talk push switch (not shown) by the person operating the transmitter and the time the audio circuit 22 becomes operative is about 0.5 second, the interval between pulses. It would only be that long if the push-to-talk switch was operated immediately following the battery saver pulse. However, even in that worst condition, virtually no part of the voice message will have been lost. At the same time, however, the receiver despite being in its carrier-squelch mode is still saving on battery life and its power is pulsed to the various components. The amount of battery saving is not as great because the receiver is off for less of the time, but by the same token, no important part of a voice message will be lost. It is noteworthy that without such modification to the rate of the battery saver pulses, a substantial part of a voice message could be lost due to the 1.75 second interval between pulses in the quiescent condition.

Turning now to FIG. 17, details of the OR gate 310 will be described. The OR gate 310 includes a NOR gate 311 having four inputs respectively coupled to the latch 172, the switch 230, the gate 270 and the gate 275. The output of the NOR gate 311 is coupled through an inverter 312 to the battery saver circuit 290 and through a pair of serially connected inverters 313 to the audio circuit 22. All four inputs to the NOR gate 311 are normally low so that its output is normally high. The output of the inverter 312 is normally low as is the output of the inverter 313 applied to the audio circuit 22. Thus, under normal conditions the audio circuit 22 is disabled and the receiver is squelched.

In the presence of any proper code, the output of the latch 172 becomes high, whereby the output of the NOR gate 311 becomes low causing the battery saver circuit 290 to produce a continuous supply voltage for the duration of such code and for a certain time thereafter, (4 or 10 seconds depending upon the character of the code). Likewise, the audio circuit 22 is enabled for such period of time.

The second input is derived from the switch 230, through of course, the Schmitt trigger 231 and some inverters 233. When the switch 230 is closed, and for the duration that it is closed, the output of the NOR gate 311 becomes low to cause the battery saver circuit 290 to provide a continuous voltage. Furthermore, the audio circuit 22 is enabled for that duration.

The third input to the NOR gate 311 is from the gate 270. If the associated control terminal 271 (FIG. 14) is connected to an enabling voltage, then the gate 270 becomes high until it is reset. Thus, the battery saver circuit 290 is caused to produce a continuous supply voltage and the audio circuit 22 is caused to be continuously on again until the switch 230 is operated.

The last input to the NOR gate 311 is derived from the gate 275. When placed in the carrier-squelch mode, this input becomes high when, and for the duration that, the carrier wave is present. The carrier wave will thus cause the battery saver circuit 290 to produce a continuous supply voltage and will cause the audio circuit 22 to be continuously operative.

While predetermined frequencies, durations, number of tones and the like have been given herein, it is to be understood that they are merely exemplary and substantial variations thereon will be readily apparent to those skilled in the art.

What has been described therefore is an improved communication receiver which can be programmed to be one of three types: code-squelch, or code-squelch/monitor; or code-squelch/carrier-squelch. In respect to the latter two types, the particular mode can be determined by operation of a push button switch. The receiver has a battery saver circuit which produces a pulsed supply voltage at one rate when the receiver is in condition to be unsquelched by code and at a faster rate when it is in condition to be unsquelch by carrier. The receiver includes a decoder circuit with various subcircuits therein that perform timing functions by means of a clock. The decoder responds very quickly to the tone so that the battery saver can produce very narrow pulses, thereby improving battery life. The decoder has means to render it nonresponsive to glitches and the like and means that render it unaffected by momentary loss of signal. The receiver responds to different durations of the code to provide alerting tones with different characteristics and to render the receiver responsive to an ensuing voice message. The circuitry that furnishes the alerting tone is effectively decoupled from the audio circuit during the voice message.

We claim:

1. In a selective call communication receiver adapted to respond to a sequence of at least first and second detected code tones, the combination comprising normally operative tone means responsive to a first detected code tone of predetermined frequency for providing a control signal persisting substantially for the duration of the first detected code tone, a source of clock pulses, duration detector means having a clock input coupled to said source of clock pulses and having a reset input coupled to said normally operative tone means and having first and second outputs, said duration detector means being rendered operative by the control signal for the duration thereof to divide the frequency of the clock pulses by first and second factors respectively associated with said first and second outputs, the values of the factors and the period of the clock pulses being selected to cause said duration detector means to produce a first output signal on said first output when the control signal exceeds a first predetermined duration and a second output signal on said second output when the control signal exceeds a second longer predetermined duration, normally inoperative tone means coupled to said first output and being rendered operative by the first output signal and then being responsive to a second detected code tone of predetermined frequency for providing a third output signal, and utilization means coupled to said second output and to said normally inoperative tone means and being operative to use the second output signal or the third output signal.

2. In the communication receiver of claim 1, wherein said duration detector means includes a chain of divide-by-two flip-flop circuits, and means for combining the outputs of two of said flip-flop circuits to provide said second output signal.

3. In a selective call communication receiver adapted to respond to at least one code tone, the combination comprising a source of clock pulses, a source of a train of tone pulses at the frequency of the code tone, said source of tone pulses being susceptible of producing an extraneous pulse of a duration less than a predetermined value, and delay means having a clock input coupled to said source of clock pulses and a reset input coupled to said source of tone pulses, said delay means being rendered operative by the train of tone pulses to divide the frequency of the clock pulses by a factor M, the value of M and the frequency of the clock pulses being selected to cause said delay means to produce an output signal a time after commencement of the train of tone pulses equal to the predetermined value, whereby the output signal is produced only when the duration of the tone pulses exceeds the predetermined value.

4. In the communication receiver of claim 3, wherein M is a positive integer.

5. In the communication receiver of claim 3, wherein the frequency of the clock pulses is at least ten times the frequency of the tone pulses.

6. In the communication receiver of claim 3, wherein the time between the commencement of the train of tone pulses and the occurrence of the output signal is dependent upon the extent of coincidence between the start of the train of tone pulses and the start of a clock pulse.

7. In the communication receiver of claim 3, wherein said delay means is rendered operative during the tone pulses and is inoperative between the tone pulses, whereby said delay means produces an output signal in the form of a train of output pulses during the tone pulses and no pulses between the tone pulses.

8. In the communication receiver of claim 3, wherein M is equal to 4 and the frequency of the clock pulses is 32,768 Hz.

9. In a selective call communication receiver adapted to respond to at least one detected code tone, the combination comprising a source of clock pulses, a source of a train of tone pulses persisting substantially for the duration of the detected code tone, and envelope detector means having a clock input coupled to said source of clock pulses and a reset input coupled to said source of tone pulses, said envelope detector means being reset by each of the tone pulses and being rendered operative therebetween to divide the frequency of the clock pulses by a factor N, the value of N and the frequency of the clock pulses being selected to cause said envelope detector means to produce an output pulse when no tone pulse has been produced by the source thereof for a time equal to a predetermined value, whereby no output pulse is produced as long as the gap between successive tone pulses is less than the predetermined value.

10. In the communication receiver of claim 9, wherein N is a positive integer.

11. In the communication receiver of claim 9, wherein the time between the commencement of the train of tone pulses and the occurrence of the output pulse is dependent upon the extent of coincidence between the start of the train of tone pulses and the start of the clock pulse.

12. In the communication receiver of claim 9, wherein the train of tone pulses consists of bursts of pulses, the frequency at which said bursts occur being equal to the frequency of the code tone.

13. In the communication receiver of claim 9, wherein N is equal to 8 and the frequency of the clock pulses is 512 Hz.

14. In a selective call communication receiver adapted to respond to at least one detected code tone, the combination comprising sources of first and second clock pulses, a source of a train of tone pulses at the frequency of the detected code tone, said source of tone pulses being susceptible of producing an extraneous pulse of a duration less than a first predetermined value, delay means having a clock input coupled to said source of first clock pulses and a reset input coupled to said source of tone pulses, said delay means being rendered operative by the train of tone pulses to divide the frequency of the clock pulses by a factor M, the value of M and the frequency of the first clock pulses being selected to cause said delay means to produce a train of modified tone pulses commencing a time after commencement of the train of tone pulses equal to the first predetermined value, whereby the train of modified tone pulses is produced only when the duration of the unmodified tone pulses exceeds the first predetermined value, and envelope detector means having a clock input coupled to said source of second clock pulses and a reset input coupled to said delay means, said envelope detector means being reset by each of the modified tone pulses and being rendered operative therebetween to divide the frequency of the second clock pulses by a factor N, the value of N and the period of the second clock pulses being selected to cause said envelope detector means to produce an output pulse when no modified tone pulse has been produced for a time equal to a second predetermined value, whereby no output pulse is produced as long as the gap between successive modified tone pulses is less than the second predetermined value.

15. In the communication receiver of claim 14, wherein said sources of first and second clock pulses includes an oscillator and a divider, having a first output on which the first clock pulses appear and a second output on which the second clock pulses appear.

16. In the communication receiver of claim 14, wherein the frequency of the first clock pulses is several orders of magnitude higher than the frequency of the second clock pulses.

17. In the communication receiver of claim 14, wherein M and N are positive integers.

18. In a selective call communication receiver adapted to respond to at least one detected code tone, the combination comprising sources of first and second clock pulses, a source of a train of tone pulses at the frequency of the detected code tone, said source of tone pulses being susceptible of producing an extraneous pulse of a duration less than a first predetermined value, delay means having a clock input coupled to said source of first clock pulses and a reset input coupled to said source of tone pulses, said delay means being rendered operative by the train of tone pulses to multiply the frequency of the clock pulses by a factor M, the value of M and the frequency of the first clock pulses being selected to cause said delay means to produce a train of modified tone pulses commencing a time after commencement of the train of tone pulses equal to the first predetermined value, whereby the train of modified tone pulses is produced only when the duration of the unmodified tone pulses exceeds the first predetermined value, envelope detector means having a clock input coupled to said source of second clock pulses and a reset input coupled to said delay means, said envelope detector means being reset by each of the modified tone pulses and being rendered operative therebetween to divide the frequency of the second clock pulses by a factor N, the value of N and the period of the second clock pulses being selected to cause said envelope detector means to produce an output pulse when no modified tone pulse has been produced for a time equal to a second predetermined value, whereby no output pulse is produced as long as the gap between successive modified tone pulses is less than the second predetermined value, and latch means having a set input coupled to said delay means and a reset input coupled to said envelope detector means, said latch means being set by the first of the first of the train of modified tone pulses and being reset by the output pulse to produce a control signal.

19. In a selective call communication receiver adapted to respond to at least one detected code tone, the combination comprising means for producing a control signal persisting substantially for the duration of the detected code tone, a source of clock pulses, duration detector means having a clock input coupled to said source of clock pulses and a reset input coupled to said producing means, said duration detector means being rendered operative by the control signal and for the duration thereof to divide the frequency of the clock pulses by a factor N, the value of N and the period of the clock pulses being selected to cause said duration detector means to produce an output signal only when the control signal exceeds a predetermined duration.

20. In the communication receiver of Claim 19, wherein said control signal terminates slightly after termination of the code tone.

21. In the communication receiver of claim 19, wherein N is a positive integer.

22. In a selective call communication receiver adapted to respond to at least one detected code tone, the combination comprising means for producing a control signal persisting substantially for the duration of the detected code tone, a source of clock pulses, duration detector means having a clock input coupled to said source of clock pulses and a reset input coupled to said producing means and a plurality of outputs, said duration detector means being rendered operative by the control signal and for the duration thereof to divide the frequency of the clock pulses by a corresponding plurality of factors, the values of the plurality of factors and the period of the clock pulses being selected to cause said duration detector means to produce an output signal on a first of said outputs when the control signal exceeds a first predetermined duration and to produce an output signal on a second of said outputs when the control signal exceeds a second predetermined duration and so forth until an output signal is produced on the last of said outputs when the tone signal exceeds a last predetermined duration.

23. In the communication receiver of claim 22, wherein said outputs respectively correspond to a plurality of divisors.

24. In the communication receiver of claim 22, wherein said duration detector has three outputs respectively corresponding to three divisors, the first of said divisors being 32, the second of said divisors being 128, and the third of said divisors being 256, and the frequency of the clock pulses being 512 Hz.

25. In the communication receiver of claim 22, wherein said duration detector means is constructed to cause output signals to appear on both said first and second outputs when the control signal exceeds the second predetermined duration and so forth until output signals appear on all of said outputs when the control signal exceeds the last predetermined duration.

26. In the communication receiver of claim 22, wherein said duration detector means includes a chain of divide-by-two flip-flop circuits, and means for combining the outputs of at least two of said flip-flop circuits to provide one of the output signals.

27. In the communication receiver of claim 22, wherein said duration detector means is a divider circuit having three outputs respectively corresponding to three divisors, the first of said divisors being 64, the second of said divisors being 256, and the third of said divisors being 512, and the frequency of the clock pulses being 512 Hz.

28. In a selective call communication receiver adapted to respond to at least one detected code tone, the combination comprising means for producing a control signal persisting substantially for the duration of the detected code tone, enabling means responsive to the termination of the control signal to initiate an enabling signal, and reset means responsive to the beginning of the enabling signal to produce a reset signal a predetermined time after such initiation, said enabling means being responsive to the reset signal to terminate the enabling signal, thereby to cause the enabling signal to commence substantially with termination of the code tone and to last for the predetermined time.

29. In the comunication receiver of claim 28, wherein the control signal terminates slightly after the end of the code tone.

30. In the communication receiver of claim 28, wherein said reset means includes a clock, and a divider circuit having a signal input coupled to said clock and having a reset input coupled to said enabling means.

31. In the communication receiver of claim 30, wherein said divider circuit includes a chain of divide-by-two flip-flop circuits.

32. In the communication receiver of claim 28, wherein said reset means is a divide-by-N circuit, N is equal to 32, and the frequency of the clock pulses is 512 Hz, whereby the predetermined time is about 31.25 milliseconds.

33. In a selective call communication receiver adapted to respond to a sequence of at least first and second detected code tones, the combination comprising normally operative means responsive to a first code tone of predetermined frequency for providing a first control signal persisting substantially for the duration of the detected first code tone, enabling means responsive to termination of the control signal to initiate an enabling signal, reset means responsive to the beginning of the enabling signal to produce a reset signal a predetermined time after such initiation, said enabling means being responsive to the reset signal to terminate the enabling signal, thereby to cause the enabling signal to commence substantially with termination of the code tone and to last for the predetermined time, and normally inoperative tone means being rendered operative by the enabling signal for the duration thereof and then being responsive to a detected second code tone of predetermined frequency for providing a second control signal.

34. In the communication receiver of claim 33, wherein said normally operative tone means includes filter means responsive to a code tone of predetermined frequency to provide a sinusoidal wave, means for converting the sinusoidal wave into a train of tone pulses, and envelope detector means for providing a first control signal persisting substantially for the duration of the train of tone pulses.

35. In the communication receiver of claim 33, wherein said normally inoperative tone means includes active filter means having a normally inoperative state and being rendered operative by an enabling signal to be responsive to a second code tone of predetermined frequency to provide a sinusoidal wave, said active filter means being coupled to said enabling means and being rendered operative by the enabling signal therefrom.

36. In a selective call communication receiver adapted to respond to at least one detected code tone, the combination comprising envelope detector means for providing a control signal persisting substantially for the duration of the detected code tone, latch means responsive to the control signal to provide a latch signal, AND gate means coupled to said envelope detector means and to said latch means and being responsive to the termination of the control signal and the occurrence of the latch signal to provide an enabling signal, and reset means responsive to beginning of the enabling signal to produce a reset signal a predetermined time after such initiation, said latch means being responsive to the reset signal to terminate the latch signal, thereby to cause the enabling signal to commence substantially with termination of the code tone and to last for the predetermined time.

37. In a selective call communication receiver adapted to respond to a sequence of at least first and second detected code tones, the combination comprising normally operative means responsive to a first detected code tone of predetermined frequency for providing a first control signal persisting substantially for the duration of the first detected code tone, enabling means responsive to termination of the control signal to initiate an enabling signal, reset means responsive to the beginning of the enabling signal to produce a reset signal a predetermined time after such initiation, said enabling means being responsive to the reset signal to terminate the enabling signal, thereby to cause the enabling signal to commence substantially with termination of the control signal and to last for the predetermined time, and feedback means responsive to the enabling signal to initiate a further enabling signal, normally inoperative tone means being rendered operative by the further enabling signal for the duration thereof and then being responsive to a second detected code tone of predetermined frequency for providing a second control signal persisting substantially for the duration of the second detected code tone, the second tone signal being coupled to said feedback means to cause the further enabling signal to persist substantially until termination of the second detected code tone.

38. In the communication receiver of claim 37, wherein said feedback means includes a NAND gate having a first input coupled to said enabling means and a second input coupled to said normally inoperative tone means.

39. In a selective call communication receiver adapted to respond to a sequence of at least first and second detected code tones, the combination comprising normally operative tone means responsive to a first detected code tone of predetermined frequency for providing a control signal persisting substantially for the duration of the first detected code tone, a source of clock pulses, duration detector means having a clock input coupled to said source of clock pulses and having a reset input coupled to said normally operative tone means and having first and second outputs, said duration detector means being rendered operative by the control signal for the duration thereof to divide the frequency of the clock pulses by first and second factors respectively associated with said first and second outputs, the values of the factors and the period of the clock pulses being selected to cause said duration detector means to produce a first output signal on said first output when the control signal exceeds a first predetermined duration and a second output signal on said second output when the control signal exceeds a second longer predetermined duration, said duration detector means including gate means having a control input selectively connectable to an enabling voltage and having a signal input coupled to said second output, said gate means being operative to produce a gate signal in the presence of said second output signal when an enabling signal is applied to said control input, normally inoperative tone means coupled to said first output and being rendered operative by the first output signal and then being responsive to a second detected code tone of predetermined frequency for providing a third output signal, and utilization means coupled to said gate means and to said normally inoperative tone means and being operative to use the gate signal or the third output signal.

40. In the communication receiver of claim 39, wherein the enabling voltage is ground.

41. In the communication receiver of claim 39, wherein said duration detector means has a third output corresponding to a third factor of multiplication, the value of said further factor and the period of the clock pulses being selected to cause said duration detector means to produce a third output signal on said third output when the tone signal exceeds a third predetermined duration, said gate means having a further signal input coupled to said third output, said gate means being operative to produce a gate signal when the tone signal persists for a duration corresponding to the sum of the second and third predetermined durations.

* * * * *